United States Patent
Tatsumi

(10) Patent No.: US 10,642,076 B2
(45) Date of Patent: May 5, 2020

(54) DRIVE CIRCUIT

(71) Applicant: SUMITOMO ELECTRIC INDUSTRIES, LTD., Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 8 days.

(21) Appl. No.: 16/002,231

(22) Filed: Jun. 7, 2018

(65) Prior Publication Data

US 2018/0356654 A1    Dec. 13, 2018

(30) Foreign Application Priority Data

Jun. 9, 2017  (JP) .................................. 2017-114440

(51) Int. Cl.
| | | |
|---|---|---|
| *G02F 1/01* | (2006.01) | |
| *G02F 1/225* | (2006.01) | |
| *H04B 14/06* | (2006.01) | |
| *H03K 3/356* | (2006.01) | |
| *H04B 10/50* | (2013.01) | |

(Continued)

(52) U.S. Cl.
CPC .......... *G02F 1/0121* (2013.01); *G02F 1/2257* (2013.01); *H03K 3/356113* (2013.01); *H03K 19/01812* (2013.01); *H04B 10/501* (2013.01); *H04B 10/505* (2013.01); *H04B 14/06* (2013.01); *H01S 5/0085* (2013.01); *H01S 5/0427* (2013.01)

(58) Field of Classification Search
CPC .. G02B 26/0833; G02B 26/001; G02B 27/48; B82Y 20/00; G02F 1/01
USPC ....................................... 359/237
See application file for complete search history.

(56) References Cited

U.S. PATENT DOCUMENTS 6,691,385 B2 *   2/2004  Bell ....................... A61G 17/04
                                                       27/1
7,519,301 B2    4/2009  Keil et al.
(Continued)

FOREIGN PATENT DOCUMENTS

| JP | 2002-43680 | 2/2002 |
| JP | 2004-295154 | 10/2004 |

OTHER PUBLICATIONS

Grein, C. H., et al., "Modeling of Very Long Infrared Wavelength InAs/GaInSb Strained Layer Superlattice Detectors", Materials for Infrared Detectors II, Proceedings of SPIE, vol. 4795, p. 39-p. 43 (2002).

*Primary Examiner* — Mohammed A Hasan
(74) *Attorney, Agent, or Firm* — Smith, Gambrell & Russell, LLP.

(57) ABSTRACT

A level shift circuit lowers a voltage of a first differential signal by a second voltage value and outputs a lowered first differential signal as a second differential signal. A first differential circuit receives the first differential signal and outputs a third differential signal. A second emitter follower circuit receives the third differential signal at a base of a pair of second transistors. A second differential circuit receives the second differential signal at a base of a pair of third transistors. An output terminal is electrically connected to one of a first output node electrically connected to an emitter of the one of the second transistors and a collector of the one of the third transistors and a second output node electrically connected to an emitter of the another of the second transistors and a collector of the another of the third transistors and outputs a driving signal.

5 Claims, 13 Drawing Sheets

(51) Int. Cl.
*H03K 19/018* (2006.01)
*H01S 5/042* (2006.01)
*H01S 5/00* (2006.01)

(56) References Cited

U.S. PATENT DOCUMENTS

| | | | |
|---|---|---|---|
| 7,965,476 B2* | 6/2011 | Mizuno | G01K 7/01 |
| | | | 307/77 |
| 2004/0170032 A1* | 9/2004 | Taniguchi | H03D 7/12 |
| | | | 363/37 |
| 2016/0072460 A1* | 3/2016 | Tatsumi | H03F 3/45085 |
| | | | 330/261 |
| 2019/0121121 A1* | 4/2019 | Galinski, III | G02B 26/0858 |

* cited by examiner

DRIVE CIRCUIT

TECHNICAL FIELD

An aspect of the present invention relates to a drive circuit.

BACKGROUND

An optical transmission module used in an optical communication system includes an optical modulator such as an electro-absorption modulator (EAM) or a Mach-Zehnder modulator (MZM), and a drive circuit for the optical modulator. A power density within the optical communication system has been increasing due to size reduction of the optical communication module such as an optical transmission module. A high power density makes it difficult to secure radiation of Joule heat generated by the optical communication module. Reducing power consumption of the drive circuit is a measure to suppress the generation of Joule heat. U.S. Pat. No. 7,519,301 discloses a drive circuit for outputting a driving signal via an emitter follower (EF) circuit. The drive circuit reduces the power consumption by controlling a current supplied by the current source of the emitter follower circuit in accordance with an input signal of the emitter follower circuit. However, a slow response of controlling the current source may decrease an amplitude of the output signal of the drive circuit and limit a modulation speed of the optical transmission module. A superior drive circuit which reduces power consumption thereof without degrading high-speed performance has been required for downsizing an optical communication module.

SUMMARY

According to an embodiment of an aspect of the present invention, there is provided a drive circuit that generates a driving signal for driving an optical modulator by amplifying a differential input signal including a positive-phase component having a phase and a negative-phase component having a phase opposite to the phase of the positive-phase component, the drive circuit comprising: an input terminal configured to receive the differential input signal; a first emitter follower circuit configured to receive the differential input signal via the input terminal, lower a voltage of the differential input signal by a first voltage value, and output a lowered differential input signal as a first differential signal including a positive-phase component having a phase and a negative-phase component having a phase opposite to the phase of the positive-phase component of the first differential signal; a level shift circuit configured to lower a voltage of the first differential signal by a second voltage value and output a lowered first differential signal as a second differential signal including a positive-phase component having a phase and a negative-phase component having a phase opposite to the phase of the positive-phase component of the second differential signal; a first differential circuit including a pair of first transistors each having a base, an emitter, and a collector and a first current source electrically connected in common with the emitters of the first transistors, and configured to receive the negative-phase component of the first differential signal at the base of one of the first transistors, receive the positive-phase component of the first differential signal at the base of another of the first transistors, output a positive-phase component of a third differential signal that includes the positive-phase component having a phase and a negative-phase component having a phase opposite to the phase of the positive-phase component of the third differential signal from the collector of the one of the first transistors, and output the negative-phase component of the third differential signal from the collector of the another of the first transistors; a second emitter follower circuit including a pair of second transistors each having a base, an emitter, and a collector, and configured to receive the positive-phase component of the third differential signal at the base of one of the second transistors and receive the negative-phase component of the third differential signal at the base of another of the second transistors; a second differential circuit including a pair of third transistors each having a base, an emitter, and a collector and a second current source electrically connected in common with the emitters of the third transistors, and configured to receive the negative-phase component of the second differential signal at the base of one of the third transistors and receive the positive-phase component of the second differential signal at the base of another of the third transistors; and an output terminal electrically connected to one of a first output node electrically connected to the emitter of the one of the second transistors and the collector of the one of the third transistors and a second output node electrically connected to the emitter of the another of the second transistors and the collector of the another of the third transistors, and configured to output the driving signal.

DETAILED DESCRIPTION

Figure 1:
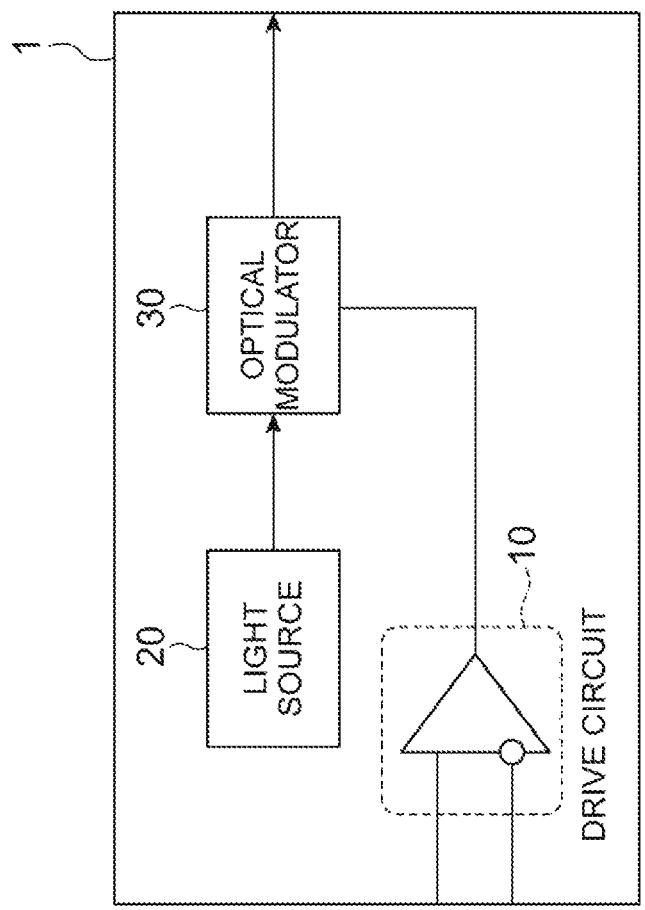
FIG. 1 is a diagram illustrating a schematic configuration of an optical transmission module to which a drive circuit according to an embodiment is applied.

Hereinafter, a drive circuit according to an embodiment of an aspect of the present invention will be described in detail with reference to the drawings. In the drawings, the same elements are denoted by the same reference signs, and duplicate description thereof will be omitted. In this specification, a transistor is assumed to include both a bipolar transistor and a field effect transistor (FET). In the following description, a case in which the transistor is a bipolar transistor having a base which is a control terminal, an emitter which is first current terminal, and a collector which is a second current terminal will be described as an example. If the transistor is the FET, the base, the emitter, and the collector may be read as a gate, a source, and a drain, respectively.

FIG. 1 is a diagram illustrating a schematic configuration of an optical transmission module to which a drive circuit according to an embodiment is applied. An optical transmission module 1 includes a drive circuit 10, a light source 20, and an optical modulator 30. The optical transmission module 1 is used, for example, in an optical communication system. The light source 20 generates continuous wave light (CW light) having a specific wavelength (peak wavelength) and supplies the continuous wave light to the optical modulator 30. An example of the light source 20 is a semiconductor laser element like laser diode. The optical modulator 30 modulates the CW light supplied from the light source 20 and outputs an optical signal. An example of the optical modulator 30 is the EAM or MZM Examples of a material for forming an optical waveguide within the optical modulator 30 are lithium niobate (LiNbO$_3$), indium phosphide (InP), silicon (Si), and the like. The drive circuit 10 is used to drive the optical modulator 30. The drive circuit 10 generates a driving signal for driving the optical modulator 30 in accordance with an input signal. The optical modulator 30 modulates the CW light in accordance with the driving signal supplied from the drive circuit 10. Examples of a modulation system are intensity modulation, phase modulation, quadrature amplitude modulation (QAM), and the like. The optical transmission module 1 is used for high-speed communication corresponding to a high modulation rate of 32 Gbaud to 56 Gbaud or higher. In this case, the drive circuit 10 handles high speed electrical signals (for example, driving signals) in a frequency band of 20 GHz to 30 GHz or more. Such a high speed signal loses some energy, when it is transmitted through a transmission line. Increasing of the speed (frequency) of the electrical signal causes the energy loss to increase, and causes electromagnetic induction and electromagnetic radiation more likely to occur. A close arrangement of the drive circuit 10 and the optical modulator 30 is preferable for shortening a transmission line therebetween and reducing the electromagnetic induction and electromagnetic radiation. Thus, the drive circuit 10 and the optical modulator 30 may be mounted in one package.

Figure 2:
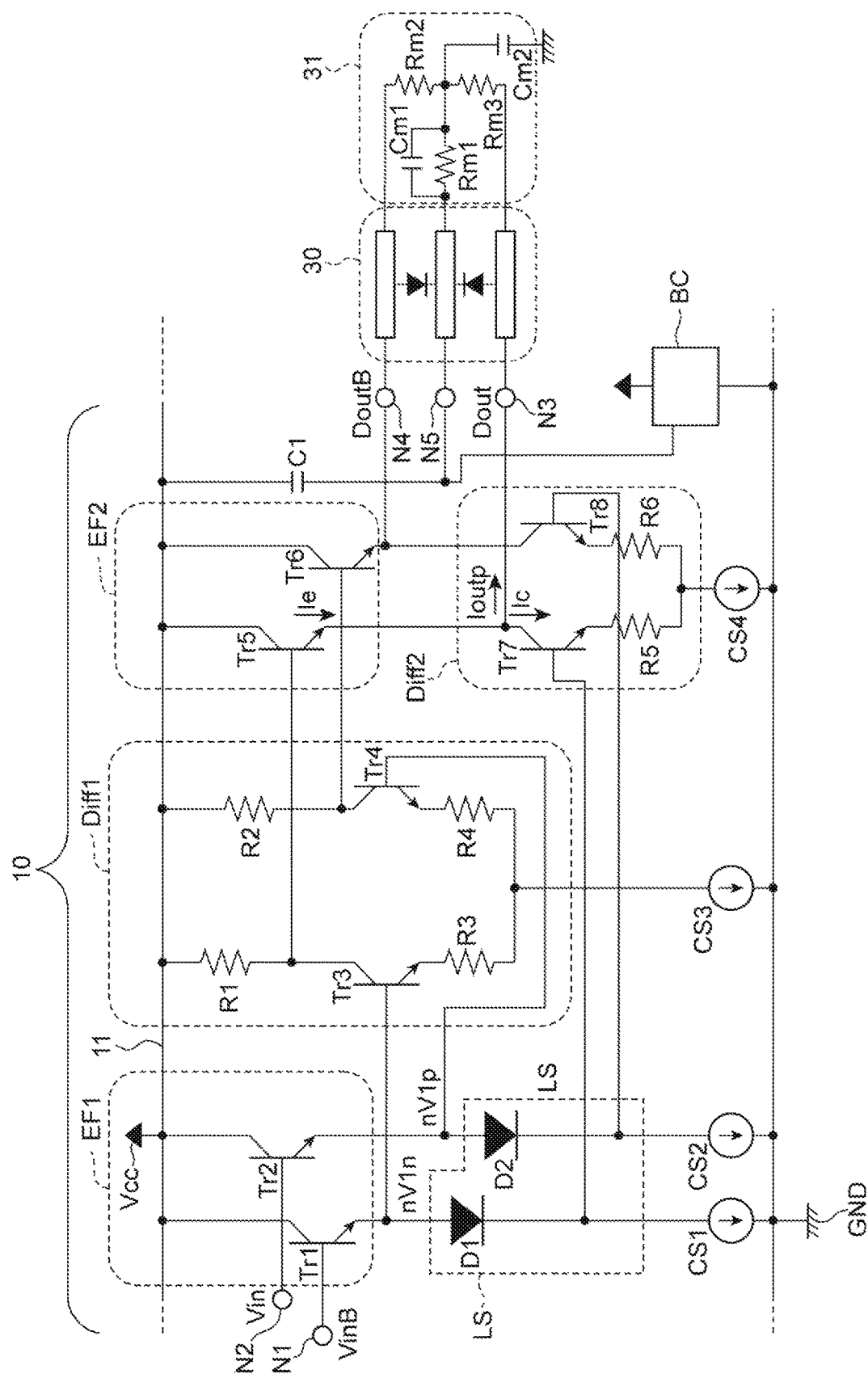
FIG. 2 is a diagram illustrating a schematic configuration of the drive circuit according to the embodiment and an optical modulator connected to the drive circuit.

FIG. 2 is a diagram illustrating a schematic configuration of the drive circuit 10 according to the embodiment, and the optical modulator 30 connected to the drive circuit 10. The drive circuit 10 operates by receiving a supply voltage supplied from a power supply (not illustrated) via the supply line 11. In the example illustrated in FIG. 2, the supply line 11 supplies a supply voltage Vcc. A reference level of the supply voltage Vcc is, for example, ground (GND) potential. The optical modulator 30 includes an optical modulator element. An optical modulator element is formed to include an optical waveguide, an electrode, a transmission line, and the like. The optical waveguide is configured to transmit CW light, an optical signal generated through modulation, or the like. The electrode is formed on the optical waveguide for applying a driving signal thereto. The transmission line transmits the driving signal to the electrode. A phase of light transmitted through the optical waveguide varies with a change in a voltage of the driving signal applied to the electrode on the optical waveguide and modulation is performed (a modulated optical signal is generated). A matching circuit 31 to be described below may be connected to a tip of the transmission line. The matching circuit 31 may be mounted within one package together with the optical modulator element. That is, the optical modulator 30 may include the optical modulator element and the matching circuit 31. The drive circuit 10 supplies the driving signal to the optical modulator 30 and drives the optical modulator 30 according to the driving signal.

The drive circuit 10 includes input nodes N1 and N2. Differential input signals Vin and VinB are input to the input nodes N1 and N2. For example, the input nodes N1 and N2 serve as input terminals when embodied as electrodes or leads on the surface of the package. The differential input signals Vin and VinB include a positive-phase component (a positive-phase signal) Vin and a negative-phase component (a negative-phase signal) VinB having a phase opposite to a phase of the positive-phase component. For example, the positive-phase component Vin and the negative-phase component VinB are a pair of complementary signals, and voltage amplitudes thereof are substantially equal to each other. The other signal voltage decreases as one signal voltage increases, and the other signal voltage increases as one signal voltage decreases. The other of the complementary signals reaches a bottom value when one of the complementary signals reaches a peak value, and the other of the complementary signals reaches a peak value (maximum value) when one of the complementary signals reaches a bottom value (minimum value). All other differential signals appearing in the following description include the above-described positive- and negative-phase components. The input node N1 is, for example, a first input node to receive the negative-phase component VinB. The input node N2 is, for example, a second input node to receive the positive-phase component Vin. Also, the differential signal has a property that a logic (a logical value) of the differential signal is inverted when the positive-phase signal and the negative-phase signal are replaced with each other. Thus, when binary data is transmitted using, for example, a non-return to zero (NRZ) signal, the positive-phase component Vin may be input to the input node N1 and the negative-phase component VinB may be input to the input node N2 in order to invert the logical value of the differential signal.

The drive circuit 10 further includes an emitter follower circuit (emitter follower) EF1. The emitter follower EF1 is an input-side emitter follower circuit provided on an input side of the drive circuit 10. The emitter follower EF1 is provided between input terminals (the input nodes N1 and N2) and differential circuits Diff1 and Diff2 described below. The emitter follower EF1 includes a transistor Tr1 and a transistor Tr2. The transistor Tr1 and the transistor Tr2 are designed so that they have substantially the same electrical characteristics. For example, the transistors are designed so that the transistors Tr1 and Tr2 have the same structure (for example, NPN-type bipolar transistor) and the same size. An example of a size of the transistor is an area of a base, an emitter and a collector. Accordingly, the transistors Tr1 and Tr2 may be handled as a pair of transistors (a pair of fourth transistors).

The base of the transistor Tr1 is electrically connected to the input node N1. A negative-phase component (a negative-phase signal) VinB is input to the base of the transistor Tr1 via the input node N1. The collector of the transistor Tr1 is electrically connected to the supply line 11. The supply voltage Vcc is applied to the collector of the transistor Tr1. The emitter of the transistor Tr1 is electrically connected to a current source CS1 via a level shift circuit (level shifter) LS to be described below. The current source CS1 is electrically connected between the level shifter LS and the ground. A current which flows from the supply line side to the ground side in the current source CS1 is substantially equal to the emitter current of the transistor Tr1. For example, the current source CS1 is configured to include a known current source circuit configured by combining an active element such as a semiconductor element and a passive element such as a resistance element. The same is true for the other current sources. The current source CS1 may be an element included in the emitter follower EF1. For example, a circuit including the transistor Tr1, a part of the level shifter LS to be described below, and the current source CS1 may be handled as an emitter follower. The emitter of the transistor Tr1 is electrically connected to the base of a transistor Tr3 of the differential circuit Diff1 and also electrically connected to the base of a transistor Tr7 of the differential circuit Diff2 via the level shifter LS. The transistor Tr1 outputs an emitter current, from the emitter, which has the same phase as the base voltage applied to the base (i.e., the same phase as the negative-phase component VinB). At the same time, the transistor Tr1 acts as an emitter follower which outputs an emitter voltage, at the emitter, which is lower than the base voltage by a base-emitter voltage. A connection point between the emitter of the transistor Tr1 and another element is referred to as a node nV1n and illustrated. The node nV1n may be the emitter of the transistor Tr1.

The base of the transistor Tr2 is electrically connected to the input node N2. A positive-phase component (a positive-phase signal) Vin is input to the base of the transistor Tr2. The collector of the transistor Tr2 is electrically connected to the supply line 11. The supply voltage Vcc is applied to the collector of the transistor Tr2. The emitter of the transistor Tr2 is electrically connected to a current source CS2 via a level shifter LS. A current which flows from the supply line side to the ground side in the current source CS2 is substantially equal to the emitter current of the transistor Tr2. The current source CS2 is electrically connected between the level shifter LS and the ground. The current value of the current source CS2 may be set to a value substantially equal to the current value of the current source CS1. The current source CS2 may be an element included in the emitter follower EF1. For example, a circuit including the transistor Tr2, a part of the level shifter LS to be described below, and the current source CS2 may be handled as an emitter follower. The emitter of the transistor Tr2 is also electrically connected to the base of a transistor Tr4 of the differential circuit Diff1 and also electrically connected to the base of a transistor Tr8 of the differential circuit Diff2 via the level shifter LS. The transistor Tr2 outputs an emitter current having the same phase as the base voltage applied to the base (i.e., the same phase as the positive-phase component Vin) from the emitter. At the same time, the transistor Tr2 acts as an emitter follower which outputs an emitter voltage, from the emitter, which is lower than the base voltage by a base-emitter voltage. A connection point between the emitter of the transistor Tr2 and another element is referred to as a node nV1p and illustrated. The node nV1p may be the emitter of the transistor Tr2.

The emitter follower EF1 allows input impedance of the drive circuit 10 to be increased. The emitter follower EF1 has a function of converting high input impedance into low output impedance, and can output an emitter current and an emitter voltage with low output impedance to drive a circuit in downstream thereof at high speed. As described above, the transistor Tr1 lowers a voltage of the negative-phase component VinB of the input differential signal by a predetermined voltage value (a base-emitter voltage value) and outputs the negative-phase component VinB with the lowered voltage to the node nV1n, and the transistor Tr2 lowers a voltage of the positive-phase component Vin of the differential input signal by a predetermined voltage value (a base-emitter voltage value) and outputs the positive-phase component Vin with the lowered voltage to the node nV1p. In other words, the emitter follower EF1 causes a voltage difference, which value is equal to the base-emitter voltage value of the transistor Tr1, between the voltage of the negative-phase component VinB and the voltage of the node nV1n. The emitter follower EF1 causes a voltage difference, which value is equal to the base-emitter voltage value of the transistor Tr2, between the voltage of the negative-phase component Vin and the voltage of the node nV1p. Accordingly, by designing the transistor Tr1 and the transistor Tr2 so that they have substantially the same electrical characteristics, the emitter follower EF1 can output a differential signal (first differential signal) obtained by lowering differential input signals by a predetermined voltage value (a first shift value) to the nodes nV1p and nV1n. The first shift value can be adjusted by varying the currents supplied by the current sources CS1 and CS2 to be described below.

The drive circuit 10 may further include the level shifter LS. The level shifter LS shifts (lowers) output voltages of the emitter follower EF1 (voltages at the nodes nV1n and nV1p) to levels suitable for bases of the transistors Tr7 and Tr8 of the differential circuit Diff2. Here, shifting the output voltage means decreasing an average voltage thereof by a predetermined value, for example, without changing shape of the waveform of the output voltage. That is, a voltage signal obtained by shifting the waveform of the output voltage downward in a voltage direction is generated. In this example, the level shifter LS includes a diode D1 and a diode D2. The diode D1 and the diode D2 are designed so that they have the same electrical characteristics. An anode of the diode D1 is electrically connected to the emitter of the transistor Tr1 and a cathode of the diode D1 is electrically connected to the base of the transistor Tr7. The cathode of the diode D1 is also electrically connected to the current source CS1 so that a forward current flows from the anode to the cathode of the diode D1. A voltage which is lower than the emitter voltage of the transistor Tr1 (the voltage of the node nV1n) by an anode-cathode voltage of the diode D1 (a forward voltage) is input to the base of the transistor Tr7. As in the diode D1, an anode of the diode D2 is electrically connected to the emitter of the transistor Tr2, and a cathode of the diode D2 is electrically connected to the base of the transistor Tr8. The cathode of the diode D2 is also electrically connected to the current source CS2 so that a forward current flows from the anode to the cathode of the diode D2. A voltage which is lower than the emitter voltage of the transistor Tr2 (the voltage of the node nV1p) by an anode-cathode voltage of the diode D2 (a forward voltage) is input to the base of the transistor Tr8. Accordingly, the level shifter LS generates a differential signal (second differential signal) obtained by decreasing the differential signal (the first differential signal) output from the emitter follower EF1 by a predetermined voltage value (a second shift value), and supplies the differential signal to the transistors Tr7 and Tr8 of the differential circuit Diff2. The second shift value is set in accordance with current-voltage characteristics of the diodes D1 and D2 and currents supplied by the current sources CS1 and CS2. For example, the second shift value is set to a forward voltage of the diodes D1 and D2.

The drive circuit 10 further includes the differential circuit Diff1. The differential circuit Diff1 is a first differential circuit provided at a stage subsequent to the emitter follower EF1. The differential circuit Diff1 includes transistors Tr3 and Tr4 and resistance elements R1 to R4. The transistor Tr3 and the transistor Tr4 are designed so that they have substantially the same electrical characteristics. Accordingly, the transistor Tr3 and the transistor Tr4 may be handled as a pair of transistors (a pair of first transistors). The resistance element R1 and the resistance element R2 are designed so that they have substantially the same resistance value. The resistance element R3 and the resistance element R4 are designed so that they have substantially the same resistance value. In other words, the differential circuit Diff1 is configured to be bilaterally symmetrical on a circuit diagram including a topology of the circuit and constants of components. The circuit configuration is bilaterally symmetrical on the circuit diagram, so that, for example, when the positive-phase component (the positive-phase signal) and the negative-phase component (the negative-phase signal) of the differential input signal are replaced with each other and the positive-phase component (the positive-phase signal) and the negative-phase component (the negative-phase signal) of the differential output signal to be output by the differential circuit Diff1 are replaced with each other, the differential circuit Diff1 with the replacement performs substantially the same operation as the differential circuit Diff1 without the replacement. The following differential circuits also have the same symmetrical feature with respect to the circuit configurations thereof.

The base of the transistor Tr3 is electrically connected to the node nV1n (the emitter of the transistor Tr1). A negative-phase component VinB, more specifically, an emitter voltage of the transistor Tr1 (a negative-phase component of the first differential signal), is input to the base of the transistor Tr3. The collector of the transistor Tr3 is electrically connected to the supply line 11 via the resistance element R1. The emitter of the transistor Tr3 is electrically connected to a current source CS3 via the resistance element R3. The current source CS3 is connected between the resistance element R3 and the ground. The current source CS3 may be an element included in the differential circuit Diff1. A collector current having substantially the same phase as the base voltage flows through the transistor Tr3 in accordance with the base voltage. The collector current flows through the resistance element R1 and a voltage drop occurs, so that a voltage having a phase opposite to a phase of the collector current is generated at the collector of the transistor Tr3. For example, when the collector current of the transistor Tr3 increases up to a peak value, which corresponds to a high level of a binary signal, the voltage of the collector (collector voltage) of the transistor Tr3 decreases down to a bottom value, which corresponds to a low level of a binary signal. Contrarily, when the collector current of the transistor Tr3 decreases down to a bottom value, which corresponds to a low level of the binary signal, the voltage of the collector (collector voltage) of the transistor Tr3 increases up to a peak value, which corresponds to a high level of the binary signal. Accordingly, the logical value of the collector voltage is inverted from that of the corrector current. The collector current has the same logical value as the base voltage. For example, a high level of the base voltage causes a high level of the collector current in the transistor Tr3. As a result, the collector of the transistor Tr3 outputs a signal having a phase substantially opposite to a phase of the negative-phase component of the first differential signal (a positive-phase component of the second differential signal). That is, the transistor Tr3 has the function of inverting the voltage signal input to the base and outputting the inverted voltage signal from the collector. Also, instead of the resistance element R1, a transistor or the like may be used as the resistance element.

The base of the transistor Tr4 is electrically connected to the node nV1p (the emitter of the transistor Tr2). The positive-phase component Vin, more specifically, the emitter voltage of the transistor Tr2 (the positive-phase component of the first differential signal), is input to the base of the transistor Tr4. The collector of the transistor Tr4 is electrically connected to the supply line 11 via the resistance element R2. The emitter of the transistor Tr4 is electrically connected to the current source CS3 via the resistance element R4. The current source CS3 is connected between the resistance element R4 and the ground. Accordingly, the emitter of the transistor Tr3 is connected to the current source CS3 via the resistance element R3, and the emitter of the transistor Tr4 is connected to the current source CS3 via the resistance element R4. A collector current having substantially the same phase as the base voltage flows through the transistor Tr4 in accordance with the base voltage. When the collector current flows through the resistance element R2 and a voltage drop occurs, a voltage having a phase opposite to a phase of the collector current is generated at the collector of the transistor Tr4. The logical value of the collector voltage is inverted from that of the corrector current and the collector current has the same logical value as the base voltage also in the transistor Tr4. As a result, the collector of the transistor Tr4 outputs a signal having a phase substantially opposite to a phase of the positive-phase component of the first differential signal (the negative-phase component of the second differential signal). That is, the transistor Tr4 has a function of inverting the voltage signal input to the base and outputting the inverted voltage signal from the collector. Instead of the resistance element R2, a transistor or the like may be used as the resistance element. Meanwhile, in the differential circuit Diff1 configured as described above, the current supplied by the current source CS3 is distributed to the collector current of the transistor Tr3 and the collector current of the transistor Tr4 in accordance with the base potential of the transistor Tr3 and the base potential of the transistor Tr4. For example, when the base potential of the transistor Tr3 is higher than the base potential of the transistor Tr4, the collector current of the transistor Tr3 is distributed to be more than the collector current of the transistor Tr4. When the base potential of the transistor Tr3 is lower than the base potential of the transistor Tr4, the collector current of the transistor Tr3 is distributed to be less than the collector current of the transistor Tr4. Also, when the base potential of the transistor Tr3 and the base potential of the transistor Tr4 are substantially equal to each other, the current supplied by the current source CS3 is distributed to the collector current of the transistor Tr3 and the collector current of the transistor Tr4 approximately in halves. When the base potential of the transistor Tr3 is greater than the base voltage of the transistor Tr4 by a certain fixed value, substantially all of the current supplied by the current source CS3 flows through the transistor Tr3 and the current hardly flows through the transistor Tr4. Also, when the base potential of the transistor Tr4 is greater than the base potential of the transistor Tr3 by a certain value, substantially all of the current supplied by the current source CS3 flows through the transistor Tr4 and the current hardly flows through the transistor Tr3. Such an operation state in which substantially all of the current supplied by the current source CS3 flows through one of the transistor Tr3 and the transistor Tr4 is referred to as a saturation operation. In a saturation operation, an output signal becomes nonlinear with respect to an input signal. Thus, when a pair of complementary signals (for example, the first differential signal) are input to the base of the transistor Tr3 and the base of the transistor Tr4, the current supplied by the current source CS3 is complementarily distributed to the resistance element R1 and the resistance element R2 in accordance with a difference in voltage (voltage difference) between the complementary signals, and a differential signal (third differential signal) is output as a pair of amplified complementary signals from the collector of the transistor Tr3 and the collector of the transistor Tr4. The reference potential of the third differential signal is a voltage of the supply line 11 to which the resistance elements R1 and R2 are connected (in this case, the supply voltage Vcc). Voltage amplitudes of the positive-phase component and the negative-phase component of the third differential signal become values obtained by multiplying respective resistance values of the resistance elements R1 and R2 by a current value of the current supplied by the current source CS3. In most cases, the resistance value of the resistance element R1 is set to be equal to the resistance value of the resistance element R2, and also the resistance value of the resistance element R3 is set to be equal to the resistance value of the resistance element R4. Note that the circuit configuration of the differential circuits has bilateral symmetry. A differential voltage gain of the differential circuit Diff1 can be set, for example, according to a ratio of the resistance value of the resistance elements R1 and R2 and the resistance value of the resistance elements R3 and R4. Also, the emitters of the transistors Tr3 and Tr4 may be directly connected to the current source CS3 without using the resistance elements R3 and R4. If the resistance elements R3 and R4 are not used, the differential voltage gain becomes large and the differential circuit Diff1 is easily subjected to a saturation operation. When the resistance elements R3 and R4 are used, the differential voltage gain can be reduced and the differential circuit Diff1 can be set to perform linear amplification. When the differential circuit Diff1 performs linear amplification, the output voltage varies linearly with respect to the input voltage. In the differential circuit Diff1, a cascode transistor or the like maybe inserted between the resistance element R1 and the collector of the transistor Tr3 and between the resistance element R2 and the collector of the transistor Tr4 and the third differential signal may be output from a connection point between the cascode transistor of each of the resistance elements R1 and R2.

The drive circuit 10 further includes an emitter follower circuit (emitter follower) EF2. The emitter follower EF2 is an output-side emitter follower circuit provided at a stage subsequent to the differential circuit Diff1. The emitter follower EF2 includes a transistor Tr5 and a transistor Tr6. The transistors Tr5 and Tr6 are designed so that they have substantially the same electrical characteristics. The transistor Tr5 and the transistor Tr6 may be handled as a pair of transistors (a pair of second transistors). The base of the transistor Tr5 is electrically connected to the collector of the transistor Tr3. A signal output by the collector of the transistor Tr3 (a signal having a phase substantially opposite to a phase of the negative-phase component VinB, which is, more specifically, the positive-phase component of the third differential signal), is input to the base of the transistor Tr5. The collector of the transistor Tr5 is electrically connected to the supply line 11. The supply voltage Vcc is applied to the collector of the transistor Tr5. The emitter of the transistor Tr5 is electrically connected to a current source CS4 via the differential circuit Diff2 to be described below. The current source CS4 is connected between the differential circuit Diff2 and the ground. The current source CS4 may be an element included in the emitter follower EF2. The emitter of the transistor Tr5 is also electrically connected to the collector of the transistor Tr7 of the differential circuit Diff2. The transistor Tr5 acts as an emitter follower configured to output an emitter current having substantially the same phase as the base voltage (i.e., a phase substantially opposite to a phase of the negative-phase component VinB) and also output an emitter voltage which is lower than the base voltage by the base-emitter voltage. The emitter current of the transistor Tr5 is referred to as an emitter current Ie and illustrated.

The base of the transistor Tr6 is electrically connected to the collector of the transistor Tr4. A signal output by the collector of the transistor Tr4 (a signal having a phase substantially opposite to a phase of the positive-phase component Vin, which is, more specifically, the negative-phase component of the third differential signal) is input to the base of the transistor Tr6. The collector of the transistor Tr6 is electrically connected to the supply line 11. The supply voltage Vcc is applied to the collector of the transistor Tr6. The emitter of the transistor Tr6 is electrically connected to the current source CS4 via the differential circuit Diff2. The current source CS4 is connected between the differential circuit Diff2 and the ground. The emitter of the transistor Tr6 is also connected to the collector of the transistor Tr8 of the differential circuit Diff2. The transistor Tr6 acts as an emitter follower configured to output an emitter current having substantially the same phase as the base voltage (i.e., a phase substantially opposite to a phase of the positive-phase component Vin) and output an emitter voltage which is lower than the base voltage by a base-emitter voltage.

The drive circuit 10 further includes the differential circuit Diff2. The differential circuit Diff2 is an output-side differential circuit provided at a stage subsequent to the level shifter LS. The differential circuit Diff2 includes the transistors Tr7 and Tr8 and resistance elements R5 and R6. The transistor Tr7 and the transistor Tr8 are designed so that they have substantially the same electrical characteristics. The transistor Tr7 and the transistor Tr8 may be handled as a pair of transistors (a pair of third transistors). The resistance element R5 and the resistance element R6 are designed so that they have substantially the same resistance value. That is, the differential circuit Diff2 is configured so as to be bilaterally symmetrical on the circuit diagram including a topology of the circuit and constants of components.

The base of the transistor Tr7 is electrically connected to the cathode of the diode D1 of the level shifter LS. The negative-phase component VinB from the input node N1, more specifically, a voltage obtained by level-shifting the emitter voltage of the transistor Tr1 according to the diode D1 of the level shifter LS (a negative-phase component of the second differential signal), is input to the base of the transistor Tr7. The collector of the transistor Tr7 is electrically connected to the emitter of the transistor Tr5 of the emitter follower EF2. The emitter of the transistor Tr7 is electrically connected to the current source CS4 via the resistance element R5. A collector current having substantially the same phase as the base voltage flows through the transistor Tr7. As a result, the collector of the transistor Tr7 outputs a current signal (a collector current) having substantially the same phase as the negative-phase component VinB. The collector current of the transistor Tr7 is referred to as a collector current Ic and illustrated.

The base of the transistor Tr8 is electrically connected to the cathode of the diode D2 of the level shifter LS. The positive-phase component Vin from the input node N2, more specifically, a voltage obtained by level-shifting the emitter voltage of the transistor Tr2 according to the diode D2 of the level shifter LS (the positive-phase component of the second differential signal), is input to the base of the transistor Tr8. The collector of the transistor Tr8 is electrically connected to the emitter of the transistor Tr6 of the emitter follower EF2. The emitter of the transistor Tr8 is electrically connected to the current source CS4 via the resistance element R6. A collector current having substantially the same phase as the base voltage flows through the transistor Tr8. As a result, the collector of the transistor Tr8 outputs a current signal (a collector current) having substantially the same phase as the positive-phase component Vin.

The drive circuit 10 further includes output nodes N3 and N4. The output nodes N3 and N4 output a differential output signal (a driving signal) Dout and DoutB. The differential output signal Dout and DoutB includes a positive-phase component Dout and a negative-phase component DoutB having a phase opposite to a phase of the positive-phase component Dout. The output node N3 is a first output node which outputs the positive-phase component Dout. The output node N4 is a second output node which outputs the negative-phase component Dout B. The output nodes N3 and N4 serve as, for example, output terminals when they are embodied as electrodes or leads on the surface of the package. The output node N3 is connected between the emitter of the transistor Tr5 (one of the second transistors) of the emitter follower EF2 and the collector of the transistor Tr7 (one of the third transistors) of the differential circuit Diff2. A difference current Ie-Ic between an emitter current Ie of the transistor Tr5 and a collector current Ic of the transistor Tr7 flows outward through the output node N3. The current flowing outward through the output node N3 is referred to as an output current Ioutp and illustrated. The output node N4 is connected between the emitter of the transistor Tr6 (the other of the second transistors) of the emitter follower EF2 and the collector of the transistor Tr8 (the other of the third transistors) of the differential circuit Diff2. A difference current between the emitter current of the transistor Tr6 and the collector current of the transistor Tr8 flows outward through the output node N4. The current flowing outward through the output node N4 is referred to as an output current Ioutn (not illustrated). The function of the differential circuit Diff2 will be described below. In this example, the output currents Ioutp and Ioutn are differential signals.

In the example illustrated in FIG. 2, the optical modulator 30 is a traveling wave type MZM The optical modulator 30 includes a transmission line to transmit a driving signal. The optical modulator 30 includes a PN junction or a PIN junction diode as an optical modulator element. In the traveling wave type MZM, the electrodes formed on the optical waveguide constitute a transmission line. In this example, the optical modulator 30 has a bias circuit BC, and the drive circuit 10 further includes an output node N5 (an output terminal). The output node N5 supplies the bias voltage generated by the bias circuit BC to the optical modulator 30. The reference potential of the driving signal is set by the bias voltage and the matching circuit 31 to be described below. For example, the cathode of the PIN junction diode is connected to the output node N5 so that a reverse bias voltage (e.g., 1 to −10 V) is applied to the PIN junction diode of the optical modulator 30. A voltage higher than those of the output node N3 and the output node N4 is supplied to the output node N5 by the bias circuit BC. The bias circuit BC is connected to the supply line 11 via a capacitor C1, and generates the reverse bias voltage. Also, the bias circuit BC and the capacitor C1 may be included in the drive circuit 10. Alternatively, the bias circuit BC may be a circuit configured to detect a change (a drift) over time in the optical characteristics of the optical modulator 30 and automatically control the bias voltage to an optimum value with respect to compensation of the drift (an automatic bias control circuit). Also, the matching circuit 31 is provided for the optical modulator 30. In the example illustrated in FIG. 2, the matching circuit 31 includes resistance elements Rm1, Rm2, and Rm3 and capacitors Cm1 and Cm2 as matching elements. Among the elements, the resistance elements Rm2 and Rm3 are termination resistors and are connected to a tip (a termination) of the transmission line of the optical modulator 30 configured to transmit the driving signal. In this example, because the driving signal is a differential signal, one transmission line (an electrode formed on the optical waveguide) is provided for each of the positive-phase component and the negative-phase component of the differential signal. The optical modulator 30 includes a pair of optical waveguides. The transmission line is formed on each optical waveguide. Termination resistors are connected to transmission lines, respectively. A resistance value of the termination resistor is set to match characteristic impedance of the transmission line. The resistance value of the termination resistor is, for example, 25 to 50Ω. The driving signals Dout and DoutB are transmitted through the transmission lines of the optical modulator 30 and terminated at the resistance elements Rm2 and Rm3. Output currents Ioutp and Ioutn flow through the termination resistors Rm2 and Rm3, respectively, and generate voltages equal to the voltage signals (driving signals) Dout and DoutB, respectively. The optical modulator element performs modulation in accordance with the driving signal. In this example, the output currents Ioutp and Ioutn are complementary signals to each other, and the driving signals Dout and DoutB are also complementary signals which constitutes a differential signal. Elements other than the termination resistors Rm2 and Rm3 of the matching circuit 31 are provided to generate and stabilize the termination voltage to which the termination resistor is connected. For example, the resistance element Rm1 causes a voltage drop according to the current supplied from the output node N5, and the termination voltage is set to a value lower than a voltage output by the output node N5. Thereby, the reverse bias voltage can also be set to be applied to the optical modulator 30 at a peak voltage of the driving signal. The configuration of the matching circuit 31 is not limited to the example illustrated in FIG. 2.

According to the drive circuit 10 described above, a signal having a phase substantially opposite that of the negative-phase component VinB (the positive-phase component of the third differential signal) is input, from the differential circuit Diff1, to the base of the transistor Tr5 of the emitter follower EF2. A signal having a phase substantially opposite that of the positive-phase component Vin (a negative-phase component of the third differential signal) is input, from the differential circuit Diff1, to the base of the transistor Tr6 of the emitter follower EF2. A signal having substantially the same phase as the negative-phase component VinB (the negative-phase component of the second differential signal) is input to the base of the transistor Tr7 of the differential circuit Diff2. A signal having substantially the same phase as the positive-phase component Vin (the positive-phase component of the second differential signal) is input to the base of the transistor Tr8 of the differential circuit Diff2. In this case, a push-pull operation of the emitter follower EF2 and the differential circuit Diff2 allows the driver circuit 10 to generate the driving signals Dout and DoutB at the output node N3 and the output node N4 as described above.

Figure 3A:
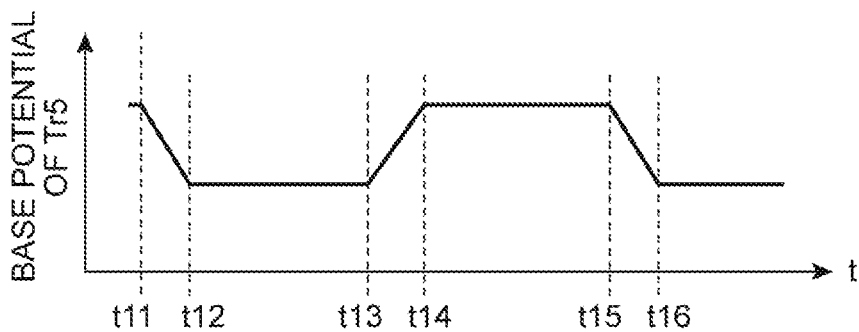
FIGS. 3A to 3D are diagrams illustrating waveforms of electrical signals in the drive circuit illustrated in FIG. 2.
Figure 3B:
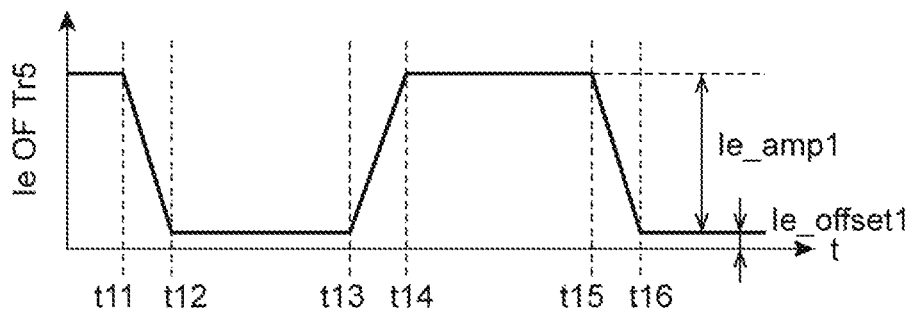
Figure 3C:
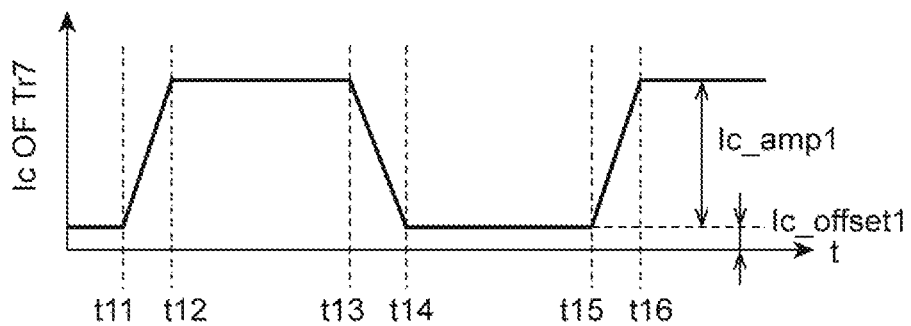
Figure 3D:
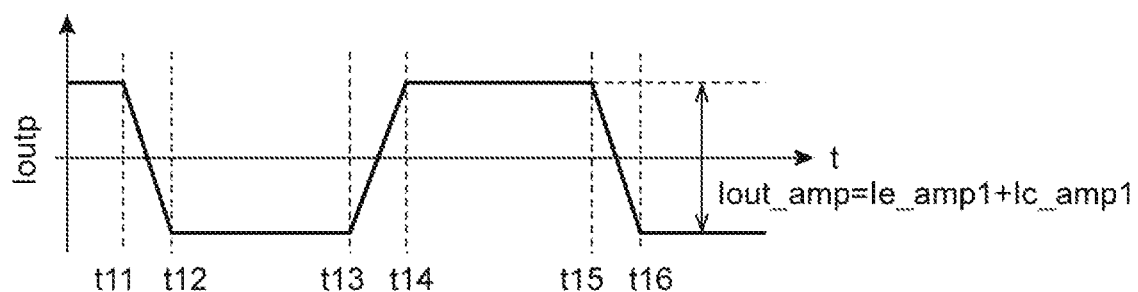

An example of the push-pull operation will be conceptually described with reference to FIGS. 3A to 3D. In the graphs of FIGS. 3A to 3D, the horizontal axis represents time t. The vertical axis of FIG. 3A represents the base potential of the transistor Tr5. The vertical axis of FIG. 3B represents the emitter current Ie of the transistor Tr5. The vertical axis of FIG. 3C represents the collector current Ic of the transistor Tr7. The vertical axis of FIG. 3D represents a magnitude of the output current Ipout flowing outward through the output node N3. A sign of the output current Ioutp is positive in a direction from the output node N3 to the optical modulator 30. Also, in the following description, the term "base potential" means a base voltage applied to the base when the reference potential is set to the ground (GND) potential. When it is unnecessary to specify the reference potential as the ground potential, it is called the base voltage. A collector potential and a collector voltage are similarly considered. In the graphs of FIG. 3A, although not illustrated, the base potential of the transistor Tr6 paired with the base potential of the transistor Tr5 is assumed to be a complementary signal whose phase is opposite to a phase of the base potential of the transistor Tr5 as described above. That is, the waveform of the base potential of the transistor Tr6 has a shape obtained by reversing the top and bottom of the waveform of the base potential of the transistor Tr5 with an average potential as a central axis.

In FIG. 3A, the base potential of the transistor Tr5 transitions from a high level (a peak value) to a low level (a bottom value) from time t11 to time t12. As illustrated in FIG. 3B, the emitter current Ie of the transistor Tr5 also transitions from the high level to the low level. On the other hand, as illustrated in FIG. 3C, the collector current Ic of the transistor Tr7 transitions from the low level to the high level. As illustrated in FIG. 3D, an output current Ioutp (i.e., Ie-Ic) changes from a positive value to a negative value. As described above, the value of the output current Ioutp becomes positive when the output current Ioutp flows in a direction of an arrow illustrated in FIG. 2, i.e., when the output current Ioutp flows from the drive circuit 10 to the optical modulator 30, and becomes negative when the output current Ioutp flows in a direction from the optical modulator 30 to the drive circuit 10. For example, when the value of the output current Ioutp is positive, the output current Ioutp flows from the emitter of the transistor Tr5 to the optical modulator 30 via the output node N3. When the value of the output current Ioutp is negative, the output current Ioutp flows (is absorbed) from the optical modulator 30 to the collector of the transistor Tr7 via the output node N3.

In FIG. 3A, the base potential of the transistor Tr5 is maintained at the low level from time t12 to t13. As illustrated in FIG. 3B, the emitter current Ie of the transistor Tr5 is also maintained at the low level. On the other hand, as illustrated in FIG. 3C, the collector current Ic of the transistor Tr7 is maintained at the high level. As a result, as illustrated in FIG. 3D, the output current Ioutp is maintained at a negative value.

In FIG. 3A, the base potential of the transistor Tr5 transitions from the low level to the high level from time t13 to time t14. As illustrated in FIG. 3B, the emitter current Ie of the transistor Tr5 also transitions from the low level to the high level. On the other hand, as illustrated in FIG. 3C, the collector current Ic of the transistor Tr7 transitions from the high level to the low level. As illustrated in FIG. 3D, the output current Ioutp transitions from a negative value to a positive value.

In FIG. 3A, the base potential of the transistor Tr5 is maintained at the high level from time t14 to time t15. As illustrated in FIG. 3B, the emitter current Ie of the transistor Tr5 is also maintained at the high level. On the other hand, as illustrated in FIG. 3C, the collector current Ic of the transistor Tr7 is maintained at the low level. As illustrated in FIG. 3D, the output current Ioutp is maintained at a positive value.

In FIG. 3A, in a period of from time t15 to time t16, as in a period from time t11 to time t12, the base potential of the transistor Tr5 transitions from the high level to the low level. As illustrated in FIG. 3B, the emitter current Ie of the transistor Tr5 also transitions from the high level to the low level. On the other hand, as illustrated in FIG. 3C, the collector current Ic of the transistor Tr7 transitions from the low level to the high level. As illustrated in FIG. 3D, the output current Ioutp transitions from a positive value to a negative value. Such an operation can be iteratively executed in accordance with the differential input signals Vin and VinB. Also, although FIGS. 3A to 3D illustrate a case in which the differential input signals Vin and VinB are NRZ signals for simplicity of description, it is also possible to use a pulse amplitude modulation signal such as, for example, PAM4, as the differential input signals Vin and VinB.

In FIGS. 3B and 3C, the transistor Tr5 and the transistor Tr7 are not completely turned off even at the low level, and an offset current flows through each of the transistor Tr5 and the transistor Tr7. In FIG. 3B, the offset current of the emitter current of the transistor Tr5 is illustrated as an offset current Ie_offset1. Also, the amplitude value of the emitter current Ie of the transistor Tr5 is illustrated as an amplitude value Ie_amp1. In FIG. 3C, the offset current of the collector current of the transistor Tr7 is illustrated as an offset current Ic_offset1. Also, the amplitude value of the collector current Ic of the transistor Tr7 is illustrated as an amplitude value Ic_amp1. If the offset current Ie_offset1 and the offset current Ic_offset1 are set to the same magnitude, the amplitude value Iout_amp of the output current Ioup becomes a sum of the amplitude value Ie_amp1 of the emitter current be of the transistor Tr5 and the amplitude value Ic_amp1 of the collector current Ic of the transistor Tr7.

The above is description of operations of transistors, one transistor from the pair of transistors included in the emitter follower EF2 and one transistor from the transistors included in the differential circuit Diff2, i.e., the transistor Tr5 (one of the second transistors) and the transistor Tr7 (one of a third transistors). Because the operations of the other transistors, i.e., the transistor Tr6 (the other of the pair of second transistors) and the transistor Tr8 (the other of the pair of third transistors), can be similarly described with respect to the base potential of the transistor Tr6, description thereof will be omitted here.

In the drive circuit 10 described above, a differential signal having a phase equal to a phase of the differential input signal (the negative-phase component VinB and the positive-phase component Vin) (third differential signal) is input, from the differential circuit Diff1, to the bases of the transistors Tr5 and Tr6 of the emitter follower EF2. A differential signal having a phase opposite to the phase of the differential input signal (the negative-phase component VinB and the positive-phase component Vin) (second differential signal) is input to the bases of the transistors Tr7 and Tr8 of the differential circuit Diff2. Accordingly, in the push-pull operation, pushing the output current Ioutp by increasing the emitter current Ie of the transistor Tr5 and decreasing the collector current Ic of the transistor Tr7 and pulling the output current Ioutp by decreasing the emitter current Ie of the transistor Tr5 and increasing the collector current Ic of the transistor Tr7 are alternatively performed for generating the driving signal Dout. The same is true for the transistor Tr6, the transistor Tr8, and the driving signal DoutB. Such a push-pull operation allows the drive circuit 10 to reduce power consumption thereof. For example, if the emitter of the transistor Tr5 of the emitter follower EF2 is directly connected to the current source CS4 without the differential circuit Diff2, the current supplied by the current source CS4 constantly flows to the ground (GND) as a direct current, which hinders the pushing operation of the transistor Tr5 but brings a constant power consumption. The push-pull operation allows the driver circuit 10 to reduce such an inefficient direct current by controlling the collector current Ic of the transistor Tr7 to a value between Ic_offset1 and Ic_offset1+Ic_amp1, which can be smaller than the current value supplied by the current source CS4, as shown FIG. 3C. Here, a case in which the differential input signal and the third differential signal have the same phase means that, for example, assuming that the differential input signal transmits binary data, if it is defined that the binary data indicates "1" when the positive-phase component of the differential input signal is at the high level and the negative-phase component thereof is at the low level and that the binary data indicates "0" when the positive-phase component of the differential input signal is at the low level and the negative-phase component thereof is at the high level, the binary data indicates "1" when the positive-phase component of the third differential signal generated in accordance with the differential input signal is at the high level and the negative-phase component thereof is at the low level and the binary data indicates "0" when the positive-phase component of the third differential signal generated in accordance with the differential input signal is at the low level and the negative-phase component thereof is at the high level.

Accordingly, for example, when the differential input signal transmits certain 8-bit binary data "01110101," the third differential signal transmits the same 8-bit binary data "01110101" with a delay time corresponding thereto. In contrast, a case in which the differential input signal and the second differential signal have opposite phases means that, for example, assuming that the differential input signal transmits binary data, if it is defined that the binary data indicates "1" when the positive-phase component of the differential input signal is at the high level and the negative-phase component thereof is at the low level and that the binary data indicates "0" when the positive-phase component of the differential input signal is at the low level and the negative-phase component thereof is at the high level, the binary data indicates "1" when the negative-phase component of the second differential signal generated in accordance with the differential input signal is at the high level and the positive-phase component thereof is at the low level and the binary data indicates "0" when the negative-phase component of the second differential signal generated in accordance with the differential input signal is at the low level and the positive-phase component thereof is at the high level. Accordingly, for example, when the differential input signal transmits certain 8-bit binary data "01110101," the second differential signal transmits 8-bit binary data "10001010" having inverted logical values with a delay time corresponding thereto. That is, the second differential signal and the third differential signal have a relationship in which logical values are constantly mutually inverted in the binary data, and are input to the differential circuit Diff2 and the emitter follower EF2 connected in series, respectively, so that the push-pull operation is performed with respect to the output current Ioutp. More specifically, the second differential signal and the third differential signal are generated so that the collector current of the transistor Tr7 decreases, the emitter current of the transistor Tr6 decreases, and the collector current of the transistor Tr8 increases, at the same time, for example, when the emitter current of the transistor Tr5 increases, on the other hand, the collector current of the transistor Tr7 increases, the emitter current of the transistor Tr6 increases, and the collector current of the transistor Tr8 decreases, at the same time, for example, when the emitter current of the transistor Tr5 decreases.

Here, in the push-pull operation, it is preferable that a phase of signals input to the bases of the transistors Tr5 (Tr6) of the emitter follower EF2 (third differential signal) is exactly opposite to a phase of the collector currents of the transistors Tr7 (Tr8) of the differential circuit Diff2 as illustrated in FIGS. 3B and 3C (the transistors Tr5 and Tr7 are exemplified in FIGS. 3B and 3C). In this case, when an operating speed of the drive circuit 10 increases (for example, when the differential output signals (driving signals) Dout and DoutB contain high-frequency components up to a higher frequency), an influence of a delay due to a base response time of the transistor in the circuit cannot be ignored. This influence will be described with reference to FIG. 4, FIGS. 5A to 5D, and FIGS. 6A to 6D.

Figure 4:
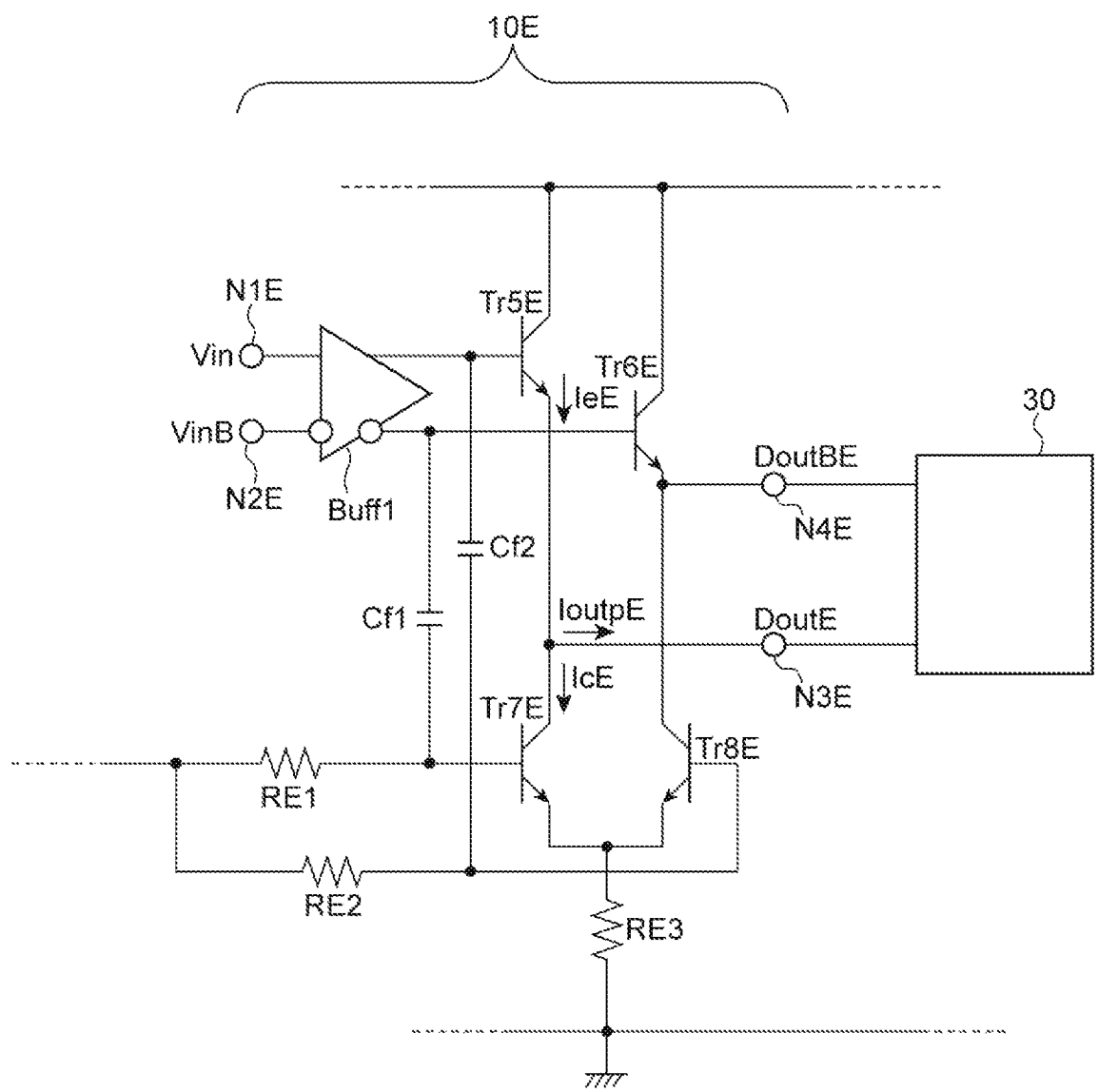
FIG. 4 is a diagram illustrating a schematic configuration of a drive circuit according to a comparative example.

FIG. 4 is a diagram illustrating a schematic configuration of a drive circuit according to a comparative example. In a drive circuit 10E according to the comparative example, differential input signals (a positive-phase component Vin and a negative-phase component VinB) input to input nodes N1E and N2E are input to bases of a transistor Tr5E and a transistor Tr6E constituting an output-side emitter follower circuit via a buffer amplifier Buff1. The differential input signals input to the input nodes N1E and N2E are also input to bases of transistors Tr7E and Tr8E constituting an output-side differential circuit via the buffer amplifier Buff1 and capacitors Cf1 and Cf2. At this time, a positive-phase component and a negative-phase component of the differential input signal are input to the respective bases of the transistor Tr5E and the transistor Tr6E, and the negative-phase component and the positive-phase component of the differential input signal are input to the respective bases of the transistor Tr7E and the transistor Tr8E for a push-pull operation. By interchanging the positive-phase and negative-phase components of the differential signal, the logical value of the signal is inverted. Therefore, when a high level is input to the transistor Tr5E, a low level is input to the transistor Tr7E. In contrast, when a low level is input to the transistor Tr5E, a high level is input to the transistor Tr7E. Likewise, a low level is input to the other of the transistors Tr6E and Tr8E when a high level is input to one of the transistors Tr6E and Tr8E, and, in contrast, a high level is input to the other of the transistors Tr6E and Tr8E when a low level is input to one of the transistors Tr6E and Tr8E. Accordingly, the transistors Tr5E and Tr7E perform a push-pull operation, and the transistors Tr6E and Tr8E perform a push-pull operation. Each push-pull operation is performed so that the logical values of the output signals are mutually inverted. That is, when a potential of a node N3E becomes a high level according to the push-pull operation of the transistors Tr5E and Tr7E, the potential of a node N4E becomes a low level according to the push-pull operation of the transistors Tr6E and Tr8E. When a potential of the node N3E becomes a low level according to the push-pull operation of the transistors Tr5E and Tr7E, the potential of the node N4E becomes a high level according to the push-pull operation of the transistors Tr6E and Tr8E. A bias voltage is applied to each of the bases of the transistor Tr7E and the transistor Tr8E via a resistance element RE1 and a resistance element RE2, respectively. The output node N3E connected between the emitter of the transistor Tr5E and the collector of the transistor Tr7E and the output node N4E connected between the emitter of the transistor Tr6 and the collector of the transistor Tr8 output a differential output signal DoutE and DoutBE for driving the optical modulator 30. In FIG. 4, a matching circuit 31, a bias circuit BC, and the like illustrated in FIG. 2 are omitted for simplification.

Here, in the drive circuit 10E according to the comparative example, the signals input to the bases of the transistors Tr5E and Tr6E constituting the emitter follower are in phase with the output signal of the buffer amplifier Buff1. On the other hand, collector currents of the transistors Tr7E and Tr8E constituting the differential circuit are delayed due to base response times of the transistors Tr7E and Tr8E. Due to this delay, the collector currents of the transistors Tr7E and Tr8E lag behind the base potentials of the transistors Tr5E and Tr6E. As a result, the following problem arises in the push-pull operation in the drive circuit 10E.

Figure 5A:
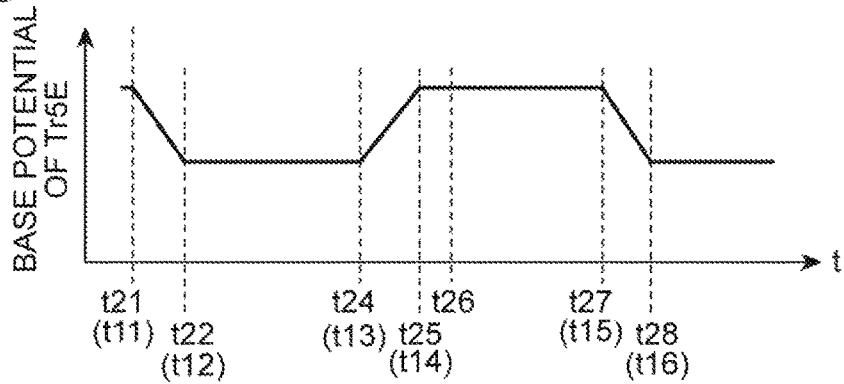
FIGS. 5A to 5D are diagrams illustrating waveforms of electrical signals in the drive circuit according to the comparative example.
Figure 5B:
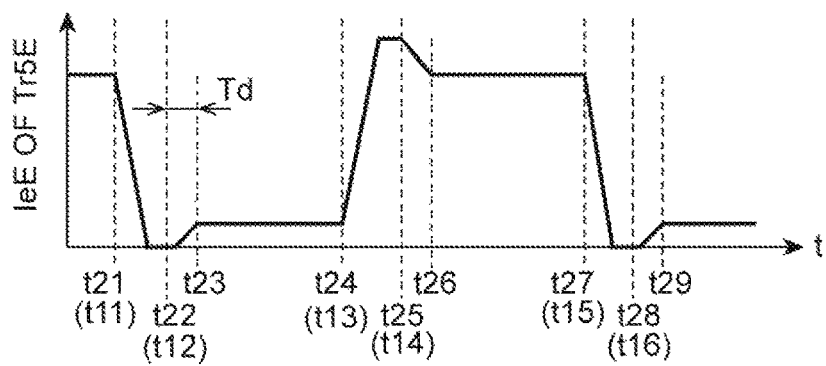
Figure 5C:
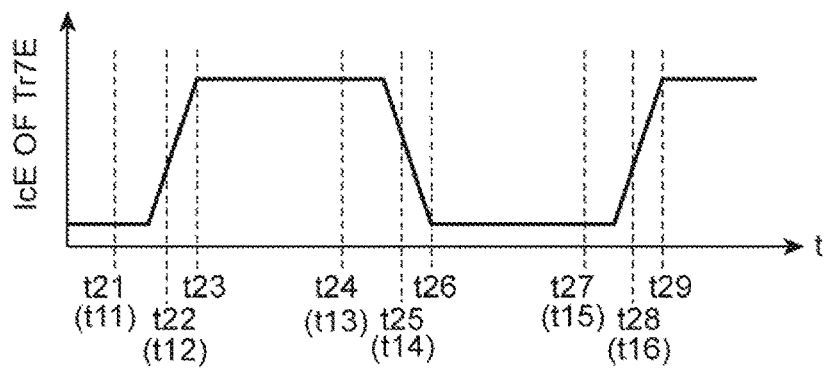
Figure 5D:
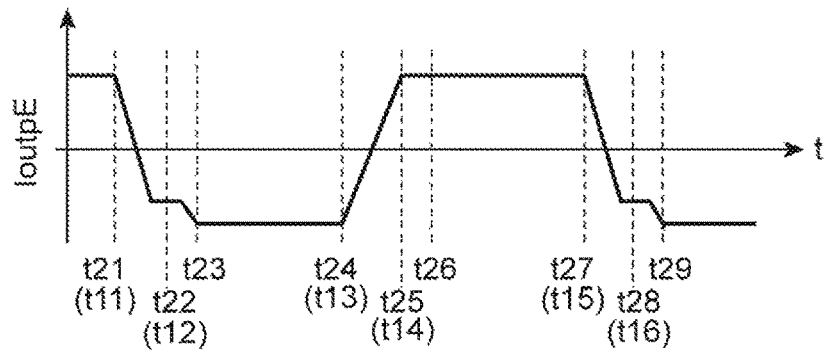

An example of the push-pull operation in the drive circuit 10E according to the comparative example will be conceptually described with reference to FIGS. 5A to 5D. In the graphs of FIGS. 5A to 5D, the horizontal axis represents time t. The vertical axis of FIG. 5A represents the base potential of the transistor Tr5E. The vertical axis of FIG. 5B represents an emitter current IeE of the transistor Tr5. The vertical axis of FIG. 5C represents a collector current IcE of the transistor Tr7. The vertical axis of FIG. 5D represents a magnitude of an output current IoutpE flowing through the output node N3E. As in the case of the output current Ioutp (FIG. 2 and FIG. 3D), the output current IoutpE is positive in the direction from the output node N3E to the optical modulator 30.

The behavior of the base potential of the transistor Tr5E illustrated in FIG. 5A is similar to that of the base potential of the transistor Tr5 described above with reference to FIG. 3A. In a period from time t21 to time t22 (corresponding to a period from time t11 to time 12 in FIG. 3A), the base potential of the transistor Tr5E transitions from the high level to the low level. In a period from time t22 to time t24 (corresponding to a period from time t12 to time t13 in FIG. 3A), the base potential of the transistor Tr5E is maintained at the low level. In a period from time t24 to time t25 (corresponding to a period from time t13 to time t14 in FIG. 3A), the base potential of the transistor Tr5E transitions from the low level to the high level. In a period from time t25 to time t27 (corresponding to a period from time t14 to time t15 in FIG. 3A), the base potential of the transistor Tr5E is maintained at the high level. In a period from time t27 to time t28 (corresponding to a period from time t15 to time t16 in FIG. 3A), the base potential of the transistor Tr5E transitions from the high level to the low level.

The emitter current IeE of the transistor Tr5E illustrated in FIG. 5B changes like the base potential illustrated in FIG. 5A, but its behavior is disturbed by the delay of the collector current IcE of the transistor Tr7E, as will be described below.

Specifically, as described above, in the drive circuit 10E according to the comparative example, the timings of the collector currents of the transistors Tr7E and Tr8E are later than the timings of the base potentials of the transistors Tr5E and Tr6E by a delay time due to the base response times of the transistors Tr7E and Tr8E. The delay time in the transistor Tr7E is referred to as a delay time Td and is illustrated in FIG. 5B. As illustrated in FIG. 5C, the collector current IcE of the transistor Tr7E reaches a high level at time t23 delayed by the delay time Td from time t22. As a result of delaying the timing at which the collector current IcE of the transistor Tr7E reaches the high level, a period in which the emitter current IeE of the transistor Tr5E does not flow (the transistor Tr5E is turned off) occurs in the vicinity of time t22 as illustrated in FIG. 5B. The same is true for the vicinity of time t28. As a result, as illustrated in FIG. 5D, the amplitude of the output current IoutpE decreases during these periods.

Figure 6A:
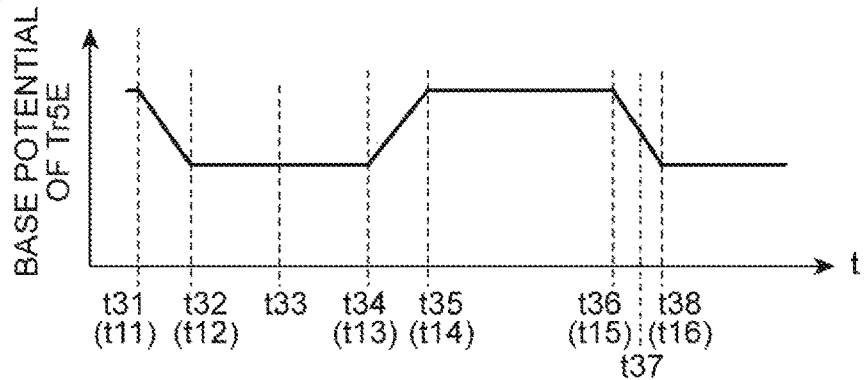
FIGS. 6A to 6D are diagrams illustrating waveforms of electrical signals in the drive circuit according to the comparative example.
Figure 6B:
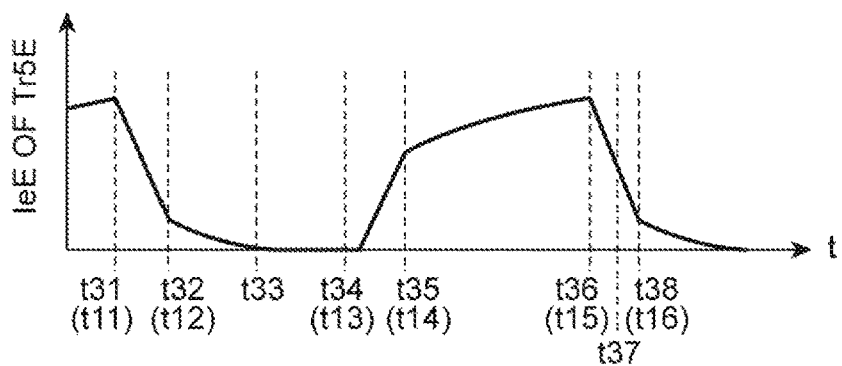
Figure 6C:
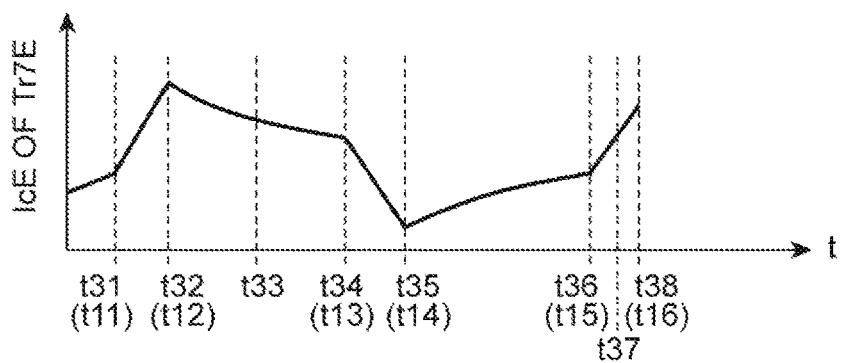
Figure 6D:
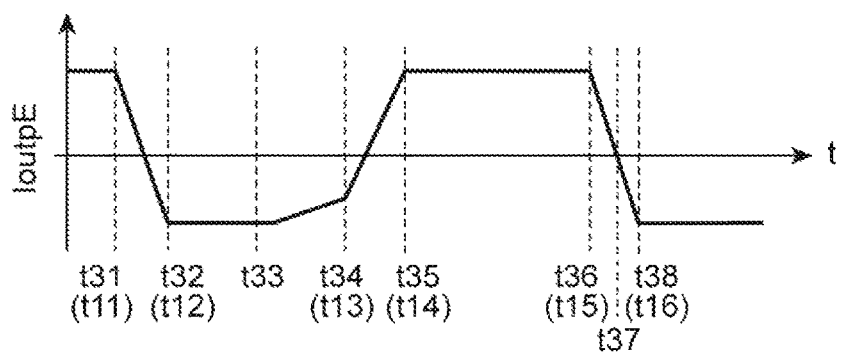

Also, in the drive circuit 10E according to the comparative example, the buffer amplifier Buff1 and the bases of the transistors Tr7E and Tr8E are subjected to capacitive coupling via the capacitors Cf1 and Cf2. In this case, because modulation amplitudes of collector currents of the transistors Tr7E and Tr8E are not maintained for a long time with respect to the input of a signal in a low-frequency band (a signal having consecutive identical bits such as "00000000") in which the impedances of the capacitors Cf1 and Cf2 are high, there is a possibility that the emitter currents of the transistors Tr5E and Tr6E will not flow (the transistors Tr5E and Tr6E will be turned off). Specifically, in the example illustrated in FIGS. 6A to 6D, because the collector current IcE of the transistor Tr7E is not accurately maintained at the high level during a period from time t32 to time t34 (corresponding to a period from time t12 to time t13 in FIGS. 3A to 3D) as illustrated in FIG. 6C, the emitter current IeE of the transistor Tr5E does not flow in a period from time t33 to time t34, as illustrated in FIG. 6B.

In contrast with the drive circuit 10E according to the comparative example described above, in the drive circuit 10 according to the present embodiment, the signals input to the respective bases of the transistors Tr5 and Tr6 of the emitter follower EF2 are delayed by the base response times of the transistors Tr3 and Tr4 of the differential circuit Diff1. The collector currents of the transistors Tr7 and Tr8 of the differential circuit Diff2 are delayed due to the base response times of the transistors Tr7 and Tr8. In this manner, amounts of delay occurring in two paths of a first path and a second path can be brought close to each other by causing a delay due to a base response time of a transistor both in a path passing from the input nodes N1 and N2 (i.e., nodes nV1n and nV1p) through the differential circuit Diff1 and the emitter follower EF2 (a first path), and a path passing from the input nodes N1 and N2 through the differential circuit Diff2 (a second path). Therefore, even when a modulation speed is high, the logical values of signals input to the bases of the transistors Tr5 and Tr6 of the emitter follower EF2 and the logic values of collector currents of the transistors Tr7 and Tr8 of the differential circuit Diff2 are complementary to each other at substantially the same timing to implement the push-pull operation as illustrated in FIGS. 3A to 3D. Therefore, such a matched timing between the complementary signals for the push-pull operation allows the drive circuit 10 to achieve both improvement in a driving speed and reduction in power consumption.

An example of a design method for matching a delay of the first path with a delay of the second path as described above will be described. Referring again to FIG. 2, when a signal propagation time from the node nV1n or nV1p (a first differential signal) to the output node N3 or N4 (a driving signal) through the differential circuit Diff1 is time $t_{pd1}$, time (delay time of the first path) $t_{pd1}$ is represented by the following Equation (1).

$$t_{pd1} = t_{b1} + t_{c1} + t_{ef1} \tag{1}$$

Here, time $t_{b1}$ is a base response time of the transistor Tr3 or Tr4. Time $t_{c1}$ is a collector response time. Time $t_{ef1}$ is an emitter follower response time of the transistor Tr5 or Tr6. In the above Equation (1), time $t_{b1}$ among the response times is dominant.

Time $t_{b1}$ can be represented using a product of a resistance value of base resistance and a capacitance value of base capacitance as shown in the following Equation (2).

$$t_{b1} \cong 0.7 \cdot r_{b1}(n_{e1}(C_{je1}+C_{d1})+n_{c1}C_{jc1}) \quad (2)$$

Here, a resistance value $r_{b1}$ is a resistance value of the base resistance of the transistor Tr3 or Tr4. A capacitance value $C_{je1}$ is a capacitance value of base-emitter junction capacitance of the transistor Tr3 or Tr4. A capacitance value $C_{d1}$ is a capacitance value of emitter diffusion capacitance. A capacitance value $C_{jc1}$ is a capacitance value of base-collector junction capacitance. A coefficient $n_{e1}$ is a Miller coefficient of the emitter node of the transistor Tr3 or Tr4. A coefficient $n_{c1}$ is a Miller coefficient of the collector node of the transistor Tr3 or Tr4.

In a state in which a sufficient emitter current flows through the transistor Tr3 or Tr4, because the capacitance value $C_{d1}$>>the capacitance value $C_{jc1}$, the above-described Equation (2) can be approximated as the following Equation (3).

$$t_{b1} \approx 0.7 \cdot r_{b1} n_{c1} C_{d1} \quad (3)$$

Time $t_{b1}$ represented by the above-described Equation (3) may correspond to the propagation time of the signal from the node nV1n or nV1p to the output node N3 or N4 through the differential circuit Diff1. This propagation time may correspond to the amount of delay occurring in the first path described above.

On the other hand, when the propagation time of the signal from the node nV1n or nV1p to the output node N3 or N4 through the differential circuit Diff2 is time $t_{pd2}$, time (delay time of the second path) $t_{pd2}$ is represented by the following Equation (4).

$$t_{pd2} = t_{diode2} + t_{b2} + t_{c2} \quad (4)$$

Here, time $t_{diode2}$ is a response time (delay time) of the diodes D1 and D2. Time $t_{b2}$ is a base response time of the transistors Tr7 and Tr8. Time $t_{c2}$ is a collector response time. In the above-described Equation (1), time $t_{b2}$ is dominant among the response times. As in the case of time $t_{b1}$, time $t_{b2}$ can be approximated by the following Equation (5).

$$t_{b2} \approx 0.7 \cdot r_{b2} n_{e2} C_{d2} \quad (5)$$

Here, a resistance value $r_{b2}$ is a resistance value of the base resistance of the transistor Tr7 or Tr8. A capacitance value $C_{d2}$ is a capacitance value of emitter diffusion capacitance. A coefficient $n_{e2}$ is a Miller coefficient of the emitter node of the transistor Tr7 or Tr8.

Time $t_{b2}$ represented by the above-described Equation (5) may correspond to the signal propagation time from the node nV1n or nV1p to the output node N3 or N4 through the differential circuit Diff2. This propagation time may correspond to an amount of delay occurring in the second path described above.

As described above, in order to matching the delay time of the first path with the delay time of the second path, time $t_{b1}$ which is a base response time of the transistor Tr3 or Tr4 represented by the above Equation (3) and time $t_{b2}$ which is a base response time of the transistor Tr7 or Tr8 represented by the above Equation (4) may be set to be close to each other. Here, if the capacitance values $C_{d1}$ and $C_{d2}$ which are emitter diffusion capacitances in the above-described Equations (3) and (5) are taken as the capacitance value $C_d$, the capacitance value $C_d$ is represented by the following Equation (6).

$$C_d = \frac{I_c}{2\pi f_T \Delta V_{be}} \quad (6)$$

Here, the capacitance value $C_d$ is one of the capacitance value $C_{d1}$ and the capacitance value $C_{d2}$. $I_C$ is a collector current. A frequency $f_T$ is a cutoff frequency of the transistor. A voltage $V_{be}$ is a base-emitter voltage.

In this case, the following requirements 1 to 3 are conceivable as requirements for adjusting the time $t_{b1}$ represented by the above-described Equation (3) and the time $t_{b2}$ represented by the above-described Equation (5) close to each other.

Requirement 1: A resistance value of the base resistance of the transistor Tr3 or Tr4 and a resistance value of the base resistance of the transistor Tr7 or Tr8 are set to be close to each other.

Requirement 2: A resistance value of the emitter resistor of the transistor Tr3 or Tr4 (which may also include the resistance value of the resistance element connected to the emitter) and a resistance value of the emitter resistor of the transistor Tr7 or Tr8 are set to be close to each other.

Requirement 3: A current value of the collector current of the transistor Tr3 or Tr4 and a current value of the collector current of the transistor Tr7 or Tr8 are set to be close to each other. Also, the cutoff frequency of the transistor Tr3 or Tr4 and the cutoff frequency of the transistor Tr7 or Tr8 are set to be close to each other.

When applied to the circuit configuration of the drive circuit 10 illustrated in FIG. 2, it is conceivable to determine exemplary circuit constants including parameters of transistors under the following conditions.

For example, a ratio of a size of the transistor Tr3 and the transistor Tr4 (a pair of first transistors) to a size of the transistor Tr7 and the transistor Tr8 (a pair of third transistors) may be set in a range of 0.8 to 1.25. By setting the sizes of the transistors to the same degree in this manner, a delay time caused by the base response time of the transistor Tr3 or Tr4 of the differential circuit Diff1 and a delay time caused by the base response time of the transistor Tr7 or Tr8 of the differential circuit Diff2 due to the sizes of the transistors can be close to each other. Therefore, it is possible to make the respective delay times of the first path and the second path close or comparable to each other.

A ratio of a current value of the current source CS3 to a current value of the current source CS4 may be set in the range of 0.8 to 1.25. By setting the current values to the same degree in this manner, a delay time caused by the base response time of the transistor Tr3 or Tr4 of the differential circuit Diff1 and a delay time caused by the base response time of the transistor Tr7 or Tr8 of the differential circuit Diff2 can be close to each other. Therefore, adjusting the ratio of the current values of the current source CS3 and CS4 allows the delay times of the first path and the second path to be close or comparable to each other.

The ratio of the resistance value of the resistance element R3 to the resistance value of the resistance element R5 may be set in the range of 0.8 to 1.25. Likewise, the ratio of the resistance value of the resistance element R4 to the resistance value of the resistance element R6 may be set in the range of 0.8 to 1.25. By setting the resistance values of the resistance elements to the same degree in this manner, the delay time caused by the base response time of the transistor Tr3 or Tr4 of the differential circuit Diff1 and the delay time caused by the base response time of the transistors Tr7 or Tr8 of the differential circuit Diff2 can be close to each other.

Therefore, adjusting the ratio of the resistance values of the resistance element R3 and R4 allows the delay times of the first path and the second path to be close or comparable to each other.

If the above-described requirements are satisfied, a difference in the delay time between the first path and the second path can be suppressed within 50%. For example, when each ratio described above is set to a lower value 0.8, a ratio of a smaller delay time to a larger delay time (reference delay time) can be calculated as $0.8 \times 0.8 \times 0.8 =$ about 0.51 and the difference in the delay time (i.e., $1 - 0.51 = 0.49$) can be set to be within 50% of the larger delay amount (i.e., 1). Note that the deference in the delay time and the smaller delay time have values normalized by the reference delay time. On the other hand, when each ratio is set to a upper value 1.25, a ratio of a larger delay time to a smaller delay time can be calculated as $1.25 \times 1.25 \times 1.25 = 1.95$, the difference in the delay time (i.e., $1.95 - 1 = 0.95$) can be set to be within 50% of a larger delay time (i.e., 1.95). It is possible to further reduce a difference in the delay time between the second path by further narrowing a range of each ratio described above.

Although an embodiment of the present invention has been described above, the present invention is not limited to the above embodiment.

Figure 7:
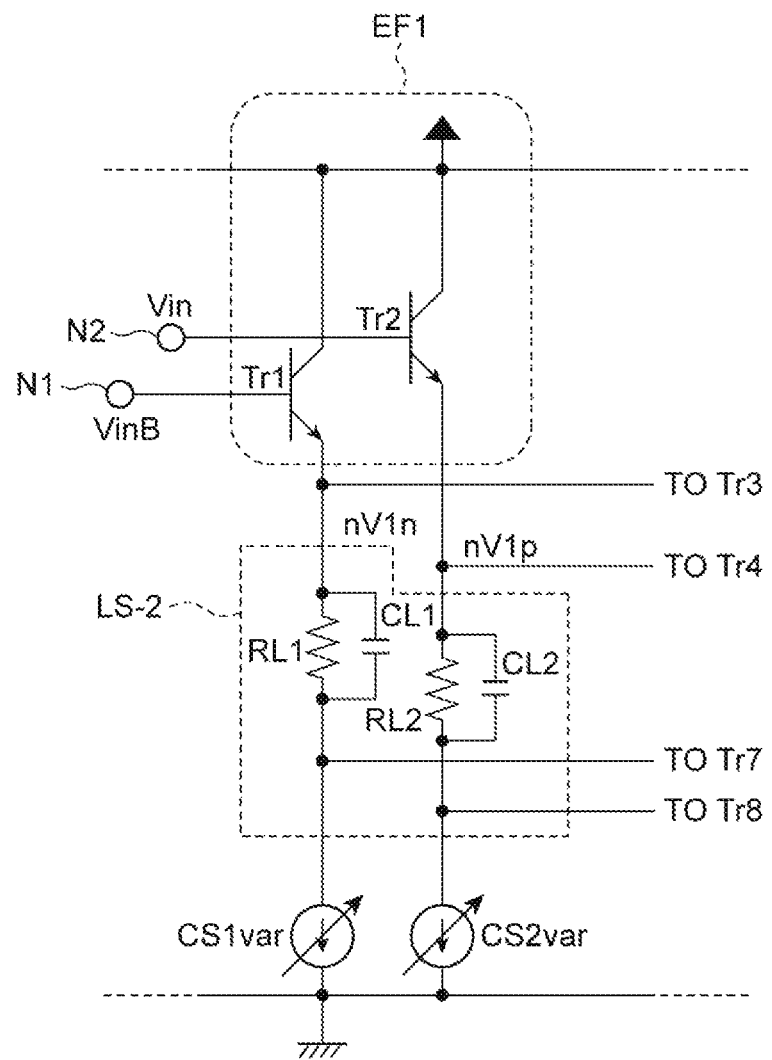
FIG. 7 is a diagram illustrating a schematic configuration of a variation of a level shift circuit in the drive circuit according to the embodiment.

Although an example of a circuit configuration including the diodes D1 and D2 as the level shifter has been described in the embodiment, other circuit configurations can be adopted. A level shifter LS-2 illustrated in FIG. 7 is different from the level shifter LS (FIG. 2) in that a resistance element RL1 and a capacitor CL1 connected in parallel to each other are included instead of the diode D1 and a resistance element RL2 and a capacitor CL2 connected in parallel to each other are included instead of the diode D2. The resistance element RL1 and the resistance element RL2 are set to substantially the same resistance value. The capacitor CL1 and the capacitor CL2 are set substantially the same capacitance value. The level shifter LS-2 shifts the emitter voltage of the transistor Tr1 by using a voltage drop of a parallel connection circuit including the resistance element RL1 and the capacitor CL1. The level shifter LS-2 shifts the emitter voltage of the transistor Tr2 by using the voltage drop of a parallel connection circuit including the resistance element RL2 and the capacitor CL2. In particular, the capacitor CL1 and capacitor CL2 allows high-frequency components contained in a signal to pass through the level shifter LS-2 with a small delay. Here, when the level shifter LS-2 is used, the current source CS1 and the current source CS2 (FIG. 2) may serve as a variable current source CS1var and a variable current source CS2var. For example, by varying the current value of the variable current source CS1var, a magnitude of the voltage drop at the resistance element RL1 can be adjusted. The magnitude of the voltage drop corresponds to a voltage value shifted by the level shifter LS-2. The current values of the variable current source CS1var and the variable current source CS2var may be set to substantially the same value. For example, the variable current source CS1var and the variable current source CS2var may include a current mirror circuit. Such a circuit configuration is suitable for setting the current values to the same value and maintaining the same value for the positive-phase component and the negative-phase component of a differential signal.

Figure 8:
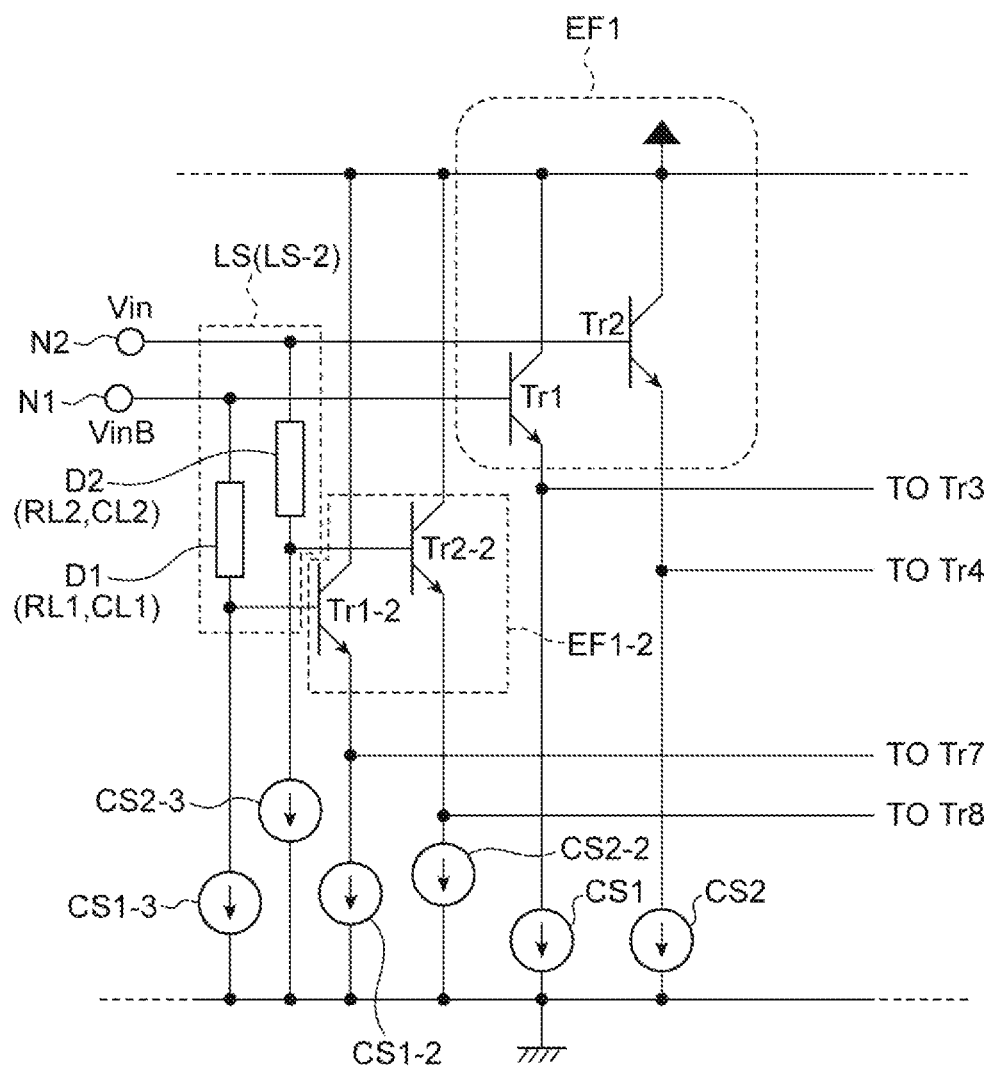
FIG. 8 is a diagram illustrating a schematic configuration of another variation of the level shift circuit.

The level shifter may be provided closer to the input nodes N1 and N2 than the emitter follower EF1. In the example illustrated in FIG. 8, the level shifter LS (FIG. 2) or the level shifter LS-2 (FIG. 7) is provided between the input nodes N1 and N2 and the emitter follower EF1. When viewed from the input nodes N1 and N2, the level shifter LS or the level shifter LS-2 is connected in parallel to the emitter follower EF1. Current sources CS1-3 and CS2-3 are connected between the level shifter LS or the level shifter LS-2 and the ground. An additional emitter follower EF1-2 is provided between the level shifter LS or the level shifter LS-2 and the differential circuit Diff2 (FIG. 2). The emitter follower EF1-2 includes a transistor Tr1-2 and a transistor Tr2-2. The transistors Tr1-2 and Tr2-2 are designed so that they have substantially the same electrical characteristics, for example, base current vs base-emitter voltage characteristic. Current sources CS1-2 and CS2-2 are connected between the emitter follower EF1-2 and the ground. The current values of the current sources CS1-2 and CS2-2 are set to substantially the same value. The emitter voltage of the transistor Tr1-2 is input to the base of the transistor Tr7 (FIG. 2). The emitter voltage of the transistor Tr2-2 is input to the base of the transistor Tr8 (FIG. 2). In the circuit configuration of FIG. 8, the negative-phase component VinB from the input node N1 is level-shifted (lowered) by the level shifter LS or the level shifter LS-2 and further passes through the transistor Tr1-2, so that a voltage obtained by subtracting a base-emitter voltage of the transistor Tr1-2 from a voltage of the negative-phase component VinB is input to the base of the transistor Tr7. As a result, as in the circuit configuration of FIG. 2 described above, a signal having a voltage level equivalent to a voltage obtained by subtracting the base-emitter voltage of the transistor Tr1 and the voltage difference (voltage drop) caused by the level shifter LS from the negative-phase component VinB is input to the base of the transistor Tr7. The same is true for the positive-phase component Vin from the input node N2.

Figure 9:
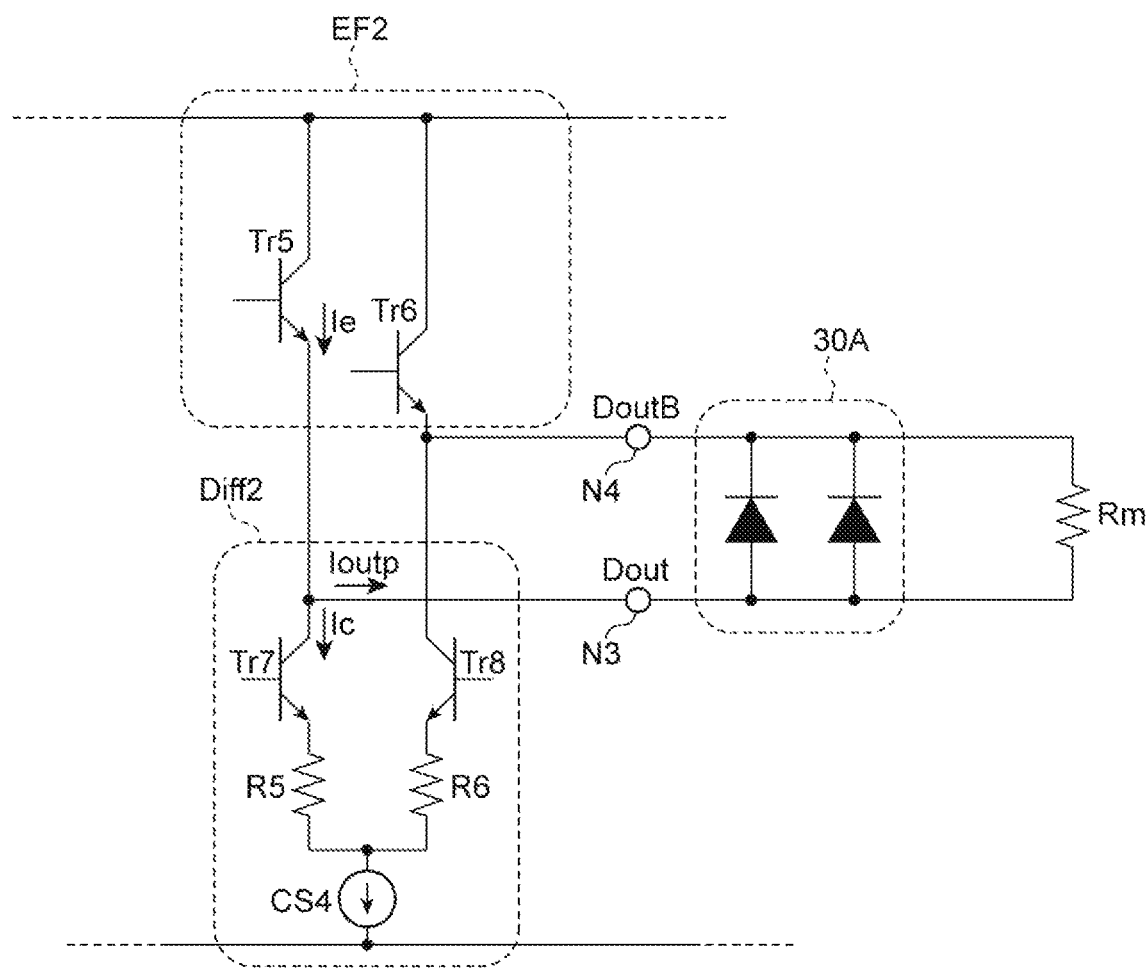
FIGS. 9 to 13 are diagrams illustrating examples of a connection configuration for other modulators.

The optical modulator may be a single-ended optical modulation element. In the example illustrated in FIG. 9, an optical modulator 30A, which is a single-ended optical modulation element, is connected to the output node N3 and the output node N4. The resistance element Rm acts as a termination resistor connected in parallel to the optical modulator 30A. For example, the resistance value of the resistance element Rm is 50 to 100Ω. In the electrode of the optical modulation element, the positional relationship between the anode and the cathode may be opposite the relationship illustrated in FIG. 9, as far as the optical modulator 30A is reverse-biased.

Figure 10:
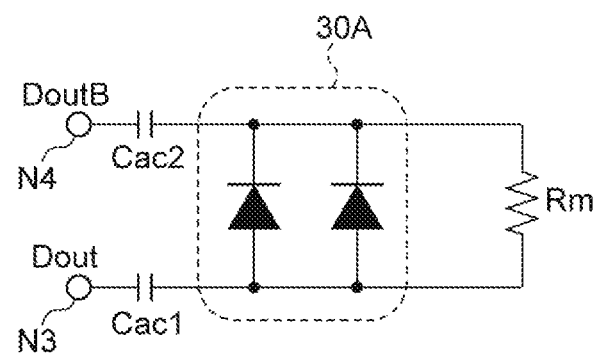

The single-ended optical modulation element may be connected to the output node N3 and the output node N4 via AC coupling. In the example illustrated in FIG. 10, where the circuit diagram of the drive circuit 10 is omitted, an AC coupling capacitor Cac1 is connected between the output node N3 and the optical modulator 30A and an AC coupling capacitor Cac2 is connected between the output node N4 and the optical modulator 30A. The capacitor Cac1 and the capacitor Cac2 have the same capacitance values, for example, of 10 pF to 0.1 µF.

Figure 11:
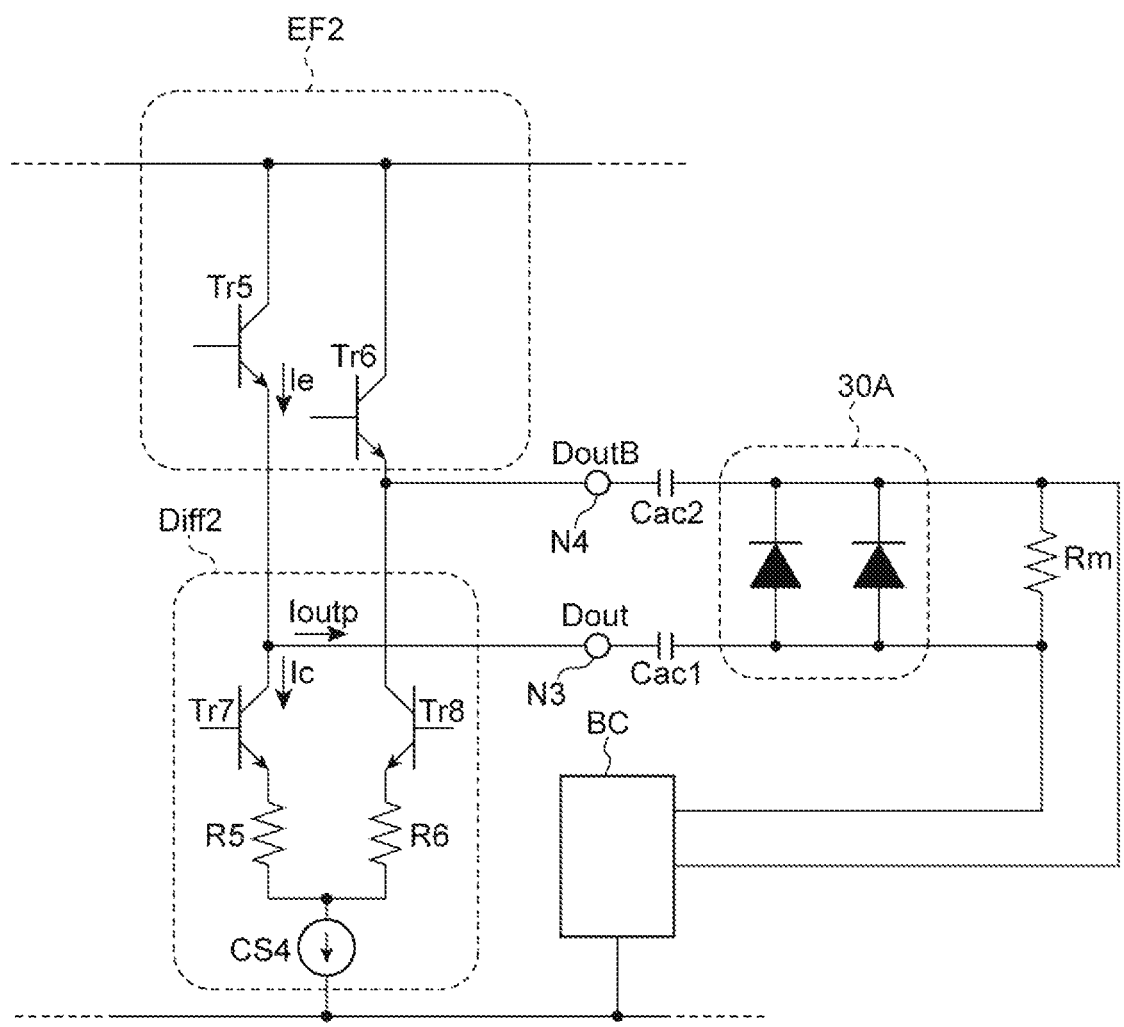

The drive circuit and the optical modulator may be subjected to AC coupling via the capacitor Cac1 and the capacitor Cac2 and a bias voltage may be applied to the modulator. In the example illustrated in FIG. 11, the bias voltage of the bias circuit BC is supplied, from the side opposite to the output node N3 and the output node N4 (i.e., the side opposite to the drive circuit 10), to the optical modulator 30A. In this case, the bias voltage is also set so that the PN junction or the PIN junction diode included in the optical modulator 30A is reverse-biased.

Figure 12:
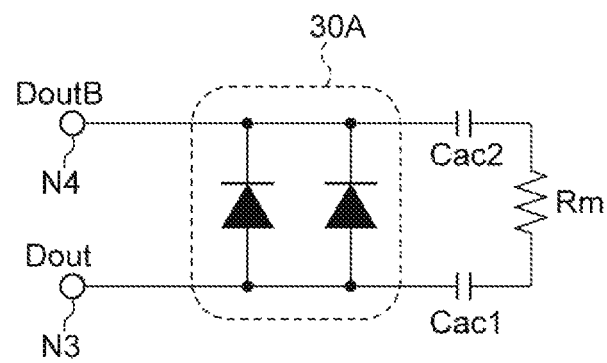

A termination resistor may be electrically connected to the optical modulator via AC coupling. In the example illustrated in FIG. 12, where the circuit diagram of the drive circuit 10 is omitted, the capacitor Cac1 and the capacitor Cac2 are connected between the optical modulator 30A and the resistance element Rm.

Figure 13:
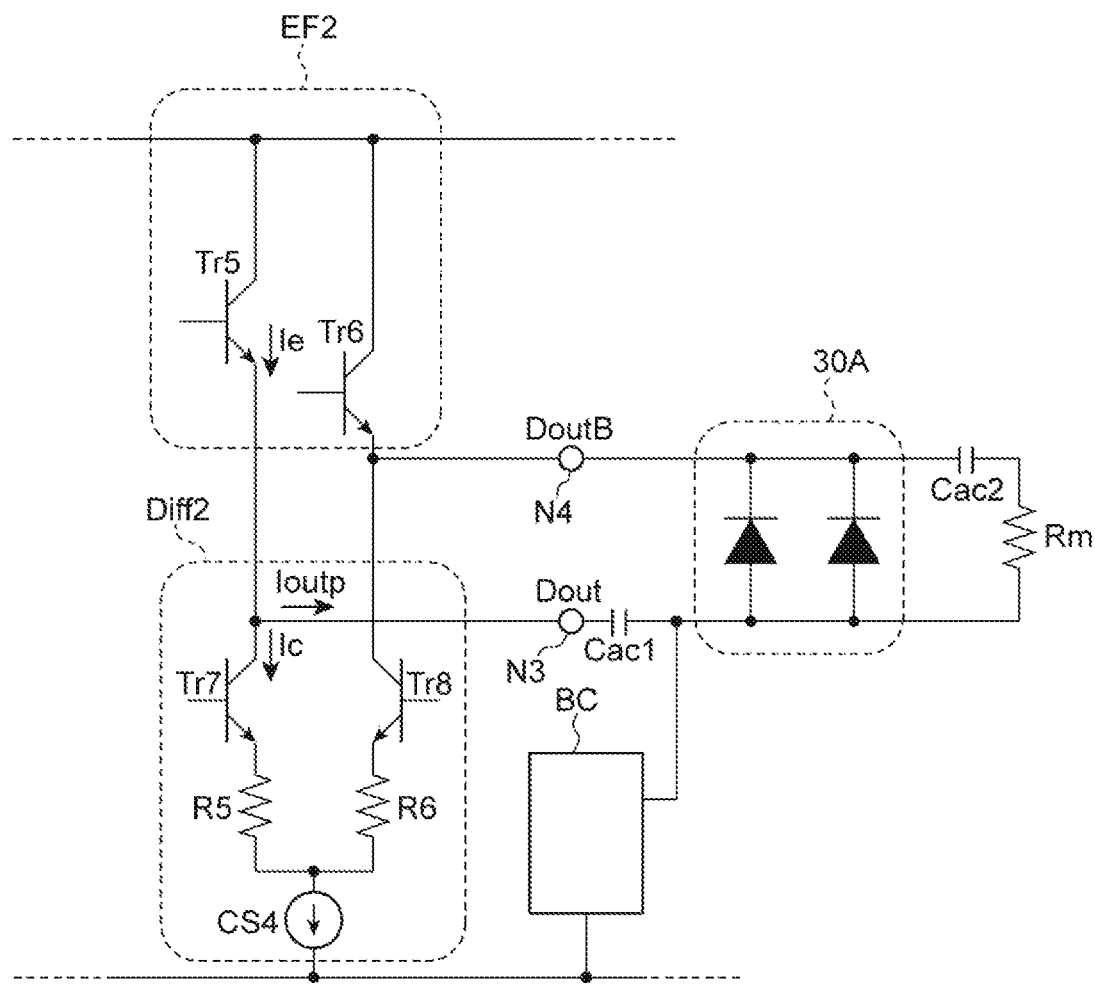

When either the optical modulator or the termination resistor is connected to the driver circuit 10 via the AC coupling, the capacitor Cac1 may be connected between the output node N3 and the optical modulator 30A, the capacitor Cac2 may be connected between the optical modulator 30A and the resistance element Rm, and the bias circuit BC may be connected between the capacitor Cac1 and the optical modulator 30A as illustrated in FIG. 13.

What is claimed is:

1. A drive circuit that generates a driving signal for driving an optical modulator by amplifying a differential input signal including a positive-phase component having a phase and a negative-phase component having a phase opposite to the phase of the positive-phase component, the drive circuit comprising:
   an input terminal configured to receive the differential input signal;
   a first emitter follower circuit configured to receive the differential input signal via the input terminal, lower a voltage of the differential input signal by a first voltage value, and output a lowered differential input signal as a first differential signal including a positive-phase component having a phase and a negative-phase component having a phase opposite to the phase of the positive-phase component of the first differential signal;
   a level shift circuit configured to lower a voltage of the first differential signal by a second voltage value and output a lowered first differential signal as a second differential signal including a positive-phase component having a phase and a negative-phase component having a phase opposite to the phase of the positive-phase component of the second differential signal;
   a first differential circuit including a pair of first transistors each having a base, an emitter, and a collector and a first current source electrically connected in common with the emitters of the first transistors, and configured to receive the negative-phase component of the first differential signal at the base of one of the first transistors, receive the positive-phase component of the first differential signal at the base of another of the first transistors, output a positive-phase component of a third differential signal that includes the positive-phase component having a phase and a negative-phase component having a phase opposite to the phase of the positive-phase component of the third differential signal from the collector of the one of the first transistors, and output the negative-phase component of the third differential signal from the collector of the another of the first transistors;
   a second emitter follower circuit including a pair of second transistors each having a base, an emitter, and a collector, and configured to receive the positive-phase component of the third differential signal at the base of one of the second transistors and receive the negative-phase component of the third differential signal at the base of another of the second transistors;
   a second differential circuit including a pair of third transistors each having a base, an emitter, and a collector and a second current source electrically connected in common with the emitters of the third transistors, and configured to receive the negative-phase component of the second differential signal at the base of one of the third transistors and receive the positive-phase component of the second differential signal at the base of another of the third transistors; and
   an output terminal electrically connected to one of a first output node electrically connected to the emitter of the one of the second transistors and the collector of the one of the third transistors and a second output node electrically connected to the emitter of the another of the second transistors and the collector of the another of the third transistors, and configured to output the driving signal.

2. The drive circuit according to claim 1, wherein the first emitter follower circuit includes a pair of fourth transistors each having a base, an emitter, and a collector, receives the negative-phase component of the differential input signal at the base of one of the fourth transistors, receives the positive-phase component of the differential input signal at the base of another of the fourth transistors, outputs the negative-phase component of the first differential signal from the emitter of the one the fourth transistors, and outputs the positive-phase component of the first differential signal from the emitter of the another of the fourth transistors.

3. The drive circuit according to claim 1,
   wherein the first transistors have a first size,
   wherein the third transistors have a second size which is equal to a value obtained by multiplying the first size by a first ratio, and
   wherein the first ratio is set to a value in a range from 0.8 to 1.25.

4. The drive circuit according to claim 1,
   wherein the first current source supplies a first current having a first current value, to the pair of the first transistors,
   wherein the second current source supplies a second current having a second current value which is equal to a value obtained by multiplying the first current value by a second ratio, to the pair of the third transistors, and
   wherein the second ratio is set to a value in a range from 0.8 to 1.25.

5. The drive circuit according to claim 1,
   wherein the first differential circuit further includes a first resistance element connected between the emitter of the one of the first transistors and the first current source and a second resistance element connected between the emitter of the another of the first transistors and the first current source,
   wherein the first resistance element and the second resistance element have a first resistance,
   wherein the second differential circuit further includes a third resistance element connected between the emitter of the one of the third transistors and the second current source and a fourth resistance element connected between the emitter of the another of the third transistors and the second current source,
   wherein the third resistance element and the fourth resistance element have a second resistance which is equal to a value obtained by multiplying the first resistance by a third ratio, and
   wherein the third ratio is set to a value in a range from 0.8 to 1.25.

* * * * *